(12) United States Patent
Watanabe

(10) Patent No.: US 6,882,671 B2
(45) Date of Patent: Apr. 19, 2005

(54) SEMICONDUCTOR LASER AND FABRICATING METHOD THEREFOR

(75) Inventor: Masanori Watanabe, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 112 days.

(21) Appl. No.: 10/608,227

(22) Filed: Jun. 30, 2003

(65) Prior Publication Data
US 2004/0125842 A1 Jul. 1, 2004

Related U.S. Application Data

(62) Division of application No. 10/234,326, filed on Sep. 5, 2002, now Pat. No. 6,670,202.

(30) Foreign Application Priority Data
Sep. 5, 2001 (JP) ........................................ 2001-268786

(51) Int. Cl.$^7$ ............................................... H01S 5/00
(52) U.S. Cl. ............................ 372/45; 372/43; 372/44; 372/46; 372/47; 372/48; 372/49; 372/50
(58) Field of Search ..................................... 372/43–50

(56) References Cited

U.S. PATENT DOCUMENTS

| 5,070,510 | A | * | 12/1991 | Konushi et al. .............. 372/46 |
| 5,573,976 | A | * | 11/1996 | Kato et al. .................... 438/42 |
| 5,770,471 | A | | 6/1998 | Nagai |
| 6,356,572 | B1 | * | 3/2002 | Tanaka et al. ................ 372/45 |
| 6,670,202 | B1 | * | 12/2003 | Watanabe .................... 438/20 |
| 2004/0066822 | A1 | * | 4/2004 | Ohkubo ....................... 372/46 |

FOREIGN PATENT DOCUMENTS

| JP | 5-218593 A | 8/1993 |
| JP | 8-46283 A | 2/1996 |
| JP | 10-150239 A | 6/1998 |
| JP | 2001-251015 A | 9/2001 |
| WO | 96/11503 | 4/1996 |

* cited by examiner

*Primary Examiner*—Min Sun Harvey
*Assistant Examiner*—Delma R. Flores-Ruiz
(74) *Attorney, Agent, or Firm*—Birch, Stewart, Kolasch & Birch, LLP.

(57) ABSTRACT

At least a lower cladding layer, an active layer for generating laser light, a first upper cladding layer, an etching stopper layer and a second upper cladding layer are stacked on a substrate. An impurity for restraining laser light absorption is diffused into the second upper cladding layer along a region where a light-emitting end surface is to be formed, under a condition that allows the etching stopper layer to maintain a function of stopping etching for the second upper cladding layer (First annealing process). Etching is performed until the etching stopper layer is reached such that the second upper cladding layer is left in a ridge shape. The impurity in the second upper cladding layer is re-diffused into the active layer to thereby cause local intermixing of the active layer in a portion extending along the light-emitting end surface and located just under the ridge (Second annealing process).

9 Claims, 21 Drawing Sheets

SEMICONDUCTOR LASER AND FABRICATING METHOD THEREFOR

This application is a divisional of Ser. No. 10/234,236 filed Sep. 5, 2002, now U.S. Pat. No. 6,670,202.

BACKGROUND OF THE INVENTION

The present invention generally relates to semiconductor lasers and more particularly to a semiconductor laser that has a window region of a small quantity of laser light absorption at its light-emitting end surfaces. A semiconductor laser of this type is applied to an optical disk drive and the like that requires a high output.

The present invention also relates to a semiconductor laser fabricating method capable of fabricating the semiconductor laser of the above-mentioned type with high accuracy.

In the high-output semiconductor laser for use in an optical disk drive or the like, the light-emitting end surface sometimes deteriorates due to high density of light, possibly causing damage called COD (Catastrophic Optical Damage). As a measure against this, it has been proposed to provide the light-emitting end surfaces with a window region that absorbs less laser light than the inside of the active layer does.

As a conventional high-output semiconductor laser that has a window region at its light-emitting end surfaces, there is one as shown in FIG. 20 (see WO96/11503). This semiconductor laser has on an n-type GaAs substrate 1 an n-conductivity type buffer layer 11, an n-conductivity type first cladding layer 2', a first separate confinement layer 2", an active layer 3, a second separate confinement layer 4", a p-conductivity type second cladding layer 4' and an etching stopper layer (having a thickness of 0.01 $\mu$m) 5. A p-conductivity type second cladding layer $4^0$, a p-conductivity type intermediate layer 9 and a p-conductivity type first contact layer 10 are provided on this etching stopper layer 5 so as to constitute a mesa 12 that extends in a striped shape in the direction of line XXI—XXI in FIG. 20. Regions at both sides of the mesa 12 are filled with an n-type current blocking layer 13. A second contact layer 6 and an electrode (connection conductor) 7 are provided over the mesa 12 and the n-type current blocking layer 13. On the other hand, an electrode (connection conductor) 8 is formed over the rear surface of the n-type GaAs substrate 1.

As shown in FIG. 21 (showing a cross section taken along the line XXI—XXI of FIG. 20), the active layer 3 is constructed of a laminate of two quantum well layers 3' and a barrier layer 3" therebetween. Portions, which belong to the active layer 3 and are located near light-emitting end surfaces (exit surfaces) 50 and 51, serve as window regions (passive regions) 3B where the laser light absorption is less than in the active layer inside 3A.

This semiconductor laser is fabricated as follows. As shown in FIG. 22, the layers of the n-conductivity type buffer layer 11 through the contact layer 10 are first grown on the n-type GaAs substrate 1 by OMVPE (organometallic vapor phase epitaxy). Next, a masking layer 30 made of silicon oxide is formed so as to have opening portions 31 and 32 along the light-emitting end surfaces 50 and 51. The wafer in this state is introduced in a closed capsule together with zinc arsenide and the capsule is heated to a temperature of 600° C., so that Zn atoms 59 diffuse from the upper surface side of the contact layer 10 beyond the active layer 3. Through these processes, local intermixing of the active layer 3 (namely making a part of the active layer 3 a mixed crystal) takes place at the portions near the light-emitting end surfaces 50 and 51, which serve as the window regions 3B where the energy bandgap is greater and accordingly the laser light absorption is less than in the active layer inside 3A. After the mask 30 is removed, a strip-shaped mask 40 is formed, which extends perpendicularly to the light-emitting end surfaces 50 and 51, as shown in FIG. 23. Next, the mesa 12 is formed just under the mask 40 by etching the semiconductor layers 10, 9, and $4_0$ at portions on both sides of the mask 40 until the etching stopper layer 5 is reached. Subsequently, as shown in FIG. 20, the blocking layer 13 is formed on both sides of the mesa 12 by OMVPE. After planarizing the blocking layer and removing the mask 40, the second contact layer 6 is formed by using the OMVPE method again. Then, the electrodes 7 and 8 are formed over the upper surface of the contact layer 6 and the lower surface of the substrate 1, respectively (the fabrication completed).

According to the aforementioned fabricating method, during the step of forming the window regions (passive regions) 3B through intermixing of the active layer 3 by diffusion of impurity, intermixing of the etching stopper layer 5 may also take place. Then, there will be a problem that the etching stopper layer 5 and the second cladding layer (lower portion) 4' are etched in the process of forming the mesa 12, which leads to reduction of the processing accuracy of the mesa 12. If the etching progresses extremely, there may arise a further problem that the current blocking layer 13 and the n-type cladding layer 11 are disadvantageously electrically short-circuited. On the other hand, if the annealing temperature and time are reduced to avoid these problems related to the fabricating process, then there may conversely arise a problem that sufficient intermixing does not take place in the window region 3B, resulting in difficulties in obtaining the effect of restraining photoabsorption.

SUMMARY OF THE INVENTION

Accordingly, it is an object of this invention to provide a semiconductor laser which has a window region in its light-emitting end surfaces and is able to be easily fabricated with high accuracy.

Another object of this invention is to provide a method for easily fabricating a semiconductor laser having a window region in its light-emitting end surfaces, with high accuracy.

In order to accomplish the first object, there is provided, according to an aspect of the present invention, a semiconductor laser, which emits laser light through a light-emitting end surface, comprising:

a lower cladding layer, an active layer for generating laser light, a first upper cladding layer and an etching stopper layer stacked in this order on a substrate;

a second upper cladding layer formed in a shape of a ridge on the etching stopper layer, the ridge extending perpendicularly to the light-emitting end surface;

a current blocking layer disposed in regions on both sides of the second upper cladding layer; and an impurity diffused in a portion extending along the light-emitting end surface from the etching stopper layer to the active layer and located at least under the ridge for local intermixing in this portion to restrain laser light absorption, wherein in a region along the light-emitting end surface, the etching stopper layer has a bandgap smaller in portions thereof disposed in positions corresponding to both sides of the ridge than in a portion thereof located just under the ridge.

In the semiconductor laser of the present invention, in the region along the light-emitting end surface, the energy bandgap of the portions, of the etching stopper layer, that correspond to both sides of the ridge is smaller than the energy bandgap of the portion, of the etching stopper layer, that is located just under the ridge. Therefore, in the region along the light-emitting end surface, the portions corresponding to both sides of the ridge of the etching stopper layer can effectively fulfill the function to stop the etching when the second upper cladding layer is formed in a ridge shape on the etching stopper layer. Therefore, this semiconductor laser is easily fabricated with high accuracy.

In one embodiment, in the region along the light-emitting end surface, the active layer has a bandgap larger in a portion thereof located just under the ridge than in portions thereof disposed in positions corresponding to both sides of the ridge.

Accordingly, the portion, which belongs to the active layer and is located just under the ridge in the region along the light-emitting end surface, can effectively restrain the COD, serving as a window region. Moreover, because intermixing does not take place in an internal region of the active layer, the fabrication becomes easy. It is to be noted that the problem of COD does not occur in the internal area of the active layer, so that the internal area of the active layer is not required to be intermixed.

In one embodiment, in the region along the light-emitting end surface, a photoluminescence wavelength shift to a shorter wavelength side due to the local intermixing of the active layer in the portion located just under the ridge is 18 nm or more. Therefore, the maximum optical output is increased by 1.41 times or more in comparison with the conventional semiconductor laser. Moreover, a photoluminescence wavelength shift to the shorter wavelength side due to the local intermixing of the active layer in the portions corresponding to both sides of the ridge is not larger than 15 nm. Therefore, fabrication becomes extremely easy.

In one embodiment, the first upper cladding layer contains a diffused impurity of Be or C, and the impurity diffused in said portion extending along the light-emitting end surface from the etching stopper layer to the active layer is Zn.

The Zn atoms easily diffuse, and the diffusion easily causes the intermixing of the active layer. Moreover, the elements Be and C have diffusion constants smaller than that of Zn. Therefore, the Zn atoms can easily be diffused into the active layer while avoiding the phenomenon of the diffusion of the diffused impurity (Be or C) contained in the first upper cladding layer into the active layer. Therefore, the semiconductor laser is easy to fabricate.

In one embodiment, the second upper cladding layer contains a diffused impurity of Be or C.

The elements of Be and C have diffusion constants smaller than that of Zn. Therefore, Zn atoms can easily be diffused into the active layer while avoiding the phenomenon of the diffusion of the diffused impurity (Be or C) contained in the second upper cladding layer into the active layer. Therefore, the semiconductor laser is easy to fabricate.

In one embodiment, the active layer comprises at least one quantum well layer and barrier layers alternating with the quantum well layer. The at least one quantum well layer is constructed of $(Al_xGa_{1-x})_yIn_{1-y}P$ ($0 \leq x \leq 1$ and $0 \leq y \leq 1$), and the barrier layers are constructed of $(Al_xGa_{1-x})_yIn_{1-y}P$ ($0 \leq x \leq 1$ and $0 \leq y \leq 1$) whose Al content (x) is greater than that of the quantum well layer.

The substance of $(Al_xGa_{1-x})_yIn_{1-y}P$ that constitutes the quantum well layer and the barrier layers is easily intermixed even when the concentration of Zn atoms to be diffused is on the order of a comparatively low value of $10^{18}$ $cm^{-3}$. Therefore, the semiconductor laser is easy to fabricate.

It should be understood that although the letters of x, y and z are herein used for expressing the compositions of the compound semiconductors, x, y and z can take different values in each of the compound semiconductors.

In one embodiment, the etching stopper layer is constructed of $Ga_yIn_{1-y}P$ ($0 \leq y \leq 1$), and the first and second upper cladding layers are each constructed of $(Al_xGa_{1-x})_yIn_{1-y}P$ ($0 \leq x \leq 1$ and $0 \leq y \leq 1$).

The substance of $Ga_yIn_{1-y}P$ ($0 \leq y \leq 1$), which constitutes the etching stopper layer, allows the substance of $(Al_xGa_{1-x})_yIn_{1-y}P$ ($0 \leq x \leq 1$ and $0 \leq y \leq 1$), which constitutes the first and second upper cladding layers, to be selectively left when the latter substance is removed by wet etching. Therefore, the second upper cladding layer is easily formed in a ridge shape on the etching stopper layer.

In one embodiment, the active layer comprises at least one quantum well layer and barrier layers alternating with the quantum well layer. The at least one quantum well layer is constructed of $In_zGa_{1-z}As$ ($0 \leq z \leq 1$) or $Al_xGa_{1-x}As$ ($0 \leq x \leq 1$), and the barrier layers are constructed of $Al_xGa_{1-x}As$ ($0 \leq x \leq 1$) whose Al content (x) is greater than that of the quantum well layer when the latter is constructed of $Al_xGa_{1-x}As$ ($0 \leq x \leq 1$).

The substance of $In_zGa_{1-z}As$ ($0 \leq z \leq 1$) and $Al_xGa_{1-x}As$ ($0 \leq x \leq 1$), either of which constitutes the quantum well layer or layers, and the substance of $Al_xGa_{1-x}As$ ($0 \leq x \leq 1$), which constitutes the barrier layers, are both easily be intermixed by the diffusion of Zn atoms. Therefore, the semiconductor laser is easy to fabricate.

In one embodiment, the etching stopper layer is constructed of $Al_xGa_{1-x}As$ ($0 \leq x \leq 0.3$), and the first and second upper cladding layers are each constructed of $Al_yGa_{1-y}As$ ($x < y \leq 1$).

The substance of $Al_xGa_{1-x}As$ ($0 \leq x \leq 0.3$), which constitutes the etching stopper layer, allows the substance of $(Al_xGa_{1-x})_yIn_{1-y}P$ ($0 \leq x \leq 1$ and $0 \leq y \leq 1$), which constitutes the first and second upper cladding layers, to be selectively left when the latter substance is removed by wet etching. Therefore, the second upper cladding layer is easily formed in a ridge shape on the etching stopper layer.

In order to accomplish the second object, there is provided, according to another aspect of the present invention, a method for fabricating a semiconductor laser that emits laser light through a light-emitting end surface, comprising:

a process for forming at least a lower cladding layer, an active layer for generating laser light, a first upper cladding layer, an etching stopper layer and a second upper cladding layer in this order on a substrate;

a first annealing process for diffusing an impurity for restraining laser light absorption into the second upper cladding layer along a region where a light-emitting end surface is to be formed, under a condition that allows the etching stopper layer to maintain a function of stopping etching for the second upper cladding layer;

an etching process for performing etching until the etching stopper layer is reached such that the second upper cladding layer is left in a ridge shape extending perpendicularly to the light-emitting end surface to be formed; and a second annealing process for re-diffusing the impurity once diffused in the region of the ridge-shaped second upper cladding layer where the light-emitting end surface is to be formed, into the active layer through the etching stopper layer to thereby cause local intermixing of the active layer in a portion that extends along the light-emitting end surface to be formed and is located just under the ridge.

According to the semiconductor laser fabricating method of the present invention, as shown by example in FIG. 18A, at least a lower cladding layer 71, an active layer 72 for generating laser light, a first upper cladding layer 73, an etching stopper layer 74 and a second upper cladding layer 76 are stacked in this order on a substrate. The first annealing process is carried out under the condition that allows the etching stopper layer to maintain the function of stopping the etching for the second upper cladding layer, or for example, under the condition of a low temperature or a short time. As shown by example in FIG. 18B, an impurity 89 is diffused from, for example, a solid diffusion source 81 to the second upper cladding layer 76, whereas the impurity is substantially not diffused to the etching stopper layer 74. Therefore, in the etching process for processing the second upper cladding layer 76 in a ridge shape, the etching stopper layer 74 can effectively stop the etching as shown by example in FIG. 18C. As a result, the processing accuracy of the ridge is increased, and the electrical short-circuit between layers is prevented. Moreover, in the second annealing process, as shown by example in FIGS. 19A and 19B, sufficient local intermixing of the active layer takes place in a portion 72B that extends along the light-emitting end surface to be formed and is located just under the ridge 76. This portion 72B where the intermixing took place operates as a window region absorbing little laser light at the light-emitting end surface after the completion of the semiconductor laser, allowing the COD to be restrained. The semiconductor laser fabricating method with the above-mentioned arrangement can easily fabricate a semiconductor laser having a window region at the light-emitting end surface with high accuracy.

In one embodiment, a photoluminescence wavelength shift to a shorter wavelength side through the first annealing process at a portion of the active layer that extends along the region where the light-emitting end surface is to be formed is not larger than 15 nm. Therefore, intermixing of the etching stopper layer hardly occurs in the first annealing process. Therefore, after the first annealing process, the function of the etching stopper layer to stop the etching for the second upper cladding layer can be maintained. Furthermore, a photoluminescence wavelength shift to the shorter wavelength side through the second annealing process at the portion of the active layer that extends along the region where the light-emitting end surface is to be formed and is located just under the ridge is 18 nm or larger. This means that sufficient local intermixing of the active layer took place at that portion in the second annealing process. This portion in which intermixing took place operates as a window region of a small quantity of laser light absorption at the light-emitting end surface after the completion of the semiconductor laser, allowing the COD to be restrained.

In one embodiment, after the etching process and before the second annealing process, the method further includes providing on the substrate an impurity evaporation preventing layer for preventing the impurity from evaporating from the second upper cladding layer to the outside.

In the state in which nothing is provided on the second upper cladding layer as shown by example in FIG. 19A, the impurity 89 will be partially evaporated from the second upper cladding layer 76 to the outside during the second annealing process. In contrast to this, as shown by example in FIG. 19B, according to the semiconductor laser fabricating method of this embodiment, the second annealing process is carried out in a state in which an impurity evaporation preventing layer 85 for preventing the evaporation of the impurity 89 from the second upper cladding layer 76 to the outside is provided. As a result, the evaporation of the impurity 89 from the second upper cladding layer 76 to the outside can be prevented. Therefore, the intermixing through the second annealing process of the active layer in the portion 72B, which extends along the region where the light-emitting end surface is to be formed and is located just under the ridge, can be further promoted.

In one embodiment, the impurity evaporation preventing layer is made of silicon oxide, silicon nitride, or alumina.

The substance of silicon oxide, silicon nitride or alumina is fine and dense and therefore suitable for preventing the evaporation of the impurity. Moreover, the substance of silicon oxide, silicon nitride or alumina can selectively be removed by an etchant that does not erode a semiconductor underlayer. Therefore, this method can easily fabricate the semiconductor laser with high accuracy.

Generally in the semiconductor laser, a compound semiconductor layer, such as a current blocking layer or the like, is formed on the etching stopper layer. In one embodiment, such a compound semiconductor layer is utilized as the impurity evaporation preventing layer. Therefore, the fabricating process can be simplified.

In one embodiment, the conductor semiconductor layer serving as the impurity evaporation preventing layer is of a conductivity type different from that of second upper cladding layer. The conductor semiconductor layer can be utilized to form a current blocking layer for restraining a wattless current.

In one embodiment, the impurity evaporation preventing layer is formed at a temperature lower than a temperature at which the impurity is re-diffused in the second annealing process.

According to the semiconductor laser fabricating method of this embodiment, the impurity is prevented from evaporating during formation of the impurity evaporation preventing layer, due to the temperature at which the impurity evaporation preventing layer is formed.

In one embodiment, the first upper cladding layer contains a diffused impurity of Be or C, and the impurity diffused in the portion of the active layer that extends along the region where the light-emitting end surface is to be formed and is located just under the ridge is Zn.

In one embodiment, the diffused impurity contained in the second upper cladding layer is Be or C.

In one embodiment, the active layer is formed by alternating at least one quantum well layer and barrier layers. The at least one quantum well layer is constructed of $(Al_xGa_{1-x})_yIn_{1-y}P$ ($0 \leq x \leq 1$ and $0 \leq y \leq 1$), the barrier layers are constructed of $(Al_xGa_{1-x})_yIn_{1-y}P$ ($0 \leq x \leq 1$ and $0 \leq y \leq 1$) whose Al content (x) is greater than that of the quantum well layer. The first annealing process is carried out under a condition of a temperature of 450° C. to 570° C. for 10 minutes or more or a temperature of 550° C. to 650° C. for 10 minutes or less. And, the second annealing process is carried out under a condition of a temperature of 570° C. to 750° C. for 10 minutes or more or a temperature of 650° C. to 850° C. for 10 minutes or less.

Under the condition of the first annealing process, when the etching stopper layer is constructed of $Ga_yIn_{1-y}P$ ($0 \leq y \leq 1$), intermixing of the etching stopper layer does not take place. Moreover, under the condition of the second annealing process, the active layer is satisfactorily activated. However, under a temperature condition that is higher than the temperature condition of the second annealing process, the diffused impurity (p-type, in particular) in the second upper cladding layer disadvantageously diffuses into regions of the active layer other than the region near the light-emitting end surface, possibly deteriorating the characteristics of a laser oscillation threshold value and so on.

The first annealing process under the conditions of a temperature of 450° C. to 570° C. and ten minutes or more can be carried out by using an ordinary annealing furnace, while the first annealing process under the conditions of a temperature of 550° C. to 650° C. and ten minutes or less can be carried out by using the RTA (Rapid Thermal Annealing) method.

Molecular beam epitaxy is a semiconductor forming technique to be carried out in a high vacuum without using hydrogen. Therefore, if the second annealing process is carried out by raising a substrate temperature when a semiconductor layer is formed by molecular beam epitaxy, then the diffused impurity inactivation due to the mixture of hydrogen can be restrained.

In one embodiment, the second annealing process is carried out in a nitrogen ambient. According to this embodiment, the diffused impurity inactivation due to the mixture of hydrogen can be restrained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
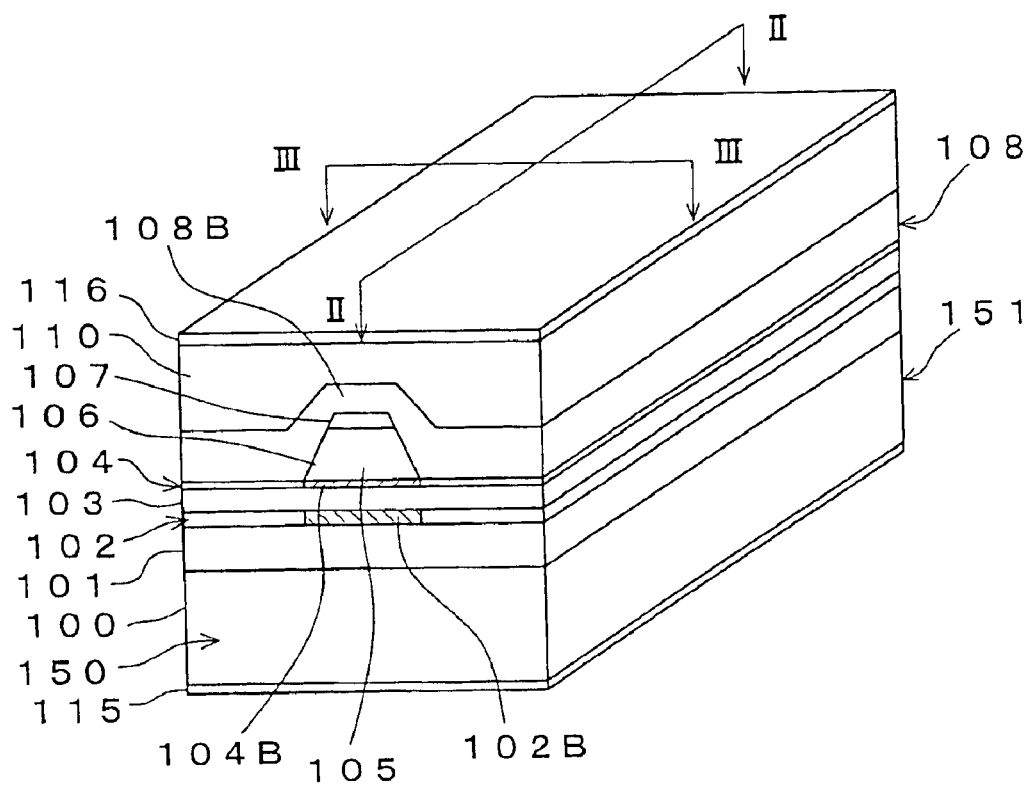
FIG. 1 is a perspective view of a semiconductor laser according to a first embodiment of the present invention.

The present invention will be described in detail below on the basis of the embodiments shown in the drawings.

Hereinafter, the substances of $(Al_xGa_{1-x})_yIn_{1-y}P$ ($0 \leq x \leq 1$ and $0 \leq y \leq 1$), $Ga_yIn_{1-y}P$ ($0 \leq y \leq 1$) and $Al_xGa_{1-x}As$ ($0 \leq x \leq 1$) will sometimes be abbreviated to AlGaInP, GaInP and AlGaAs, respectively.

(First Embodiment)

Figure 2:
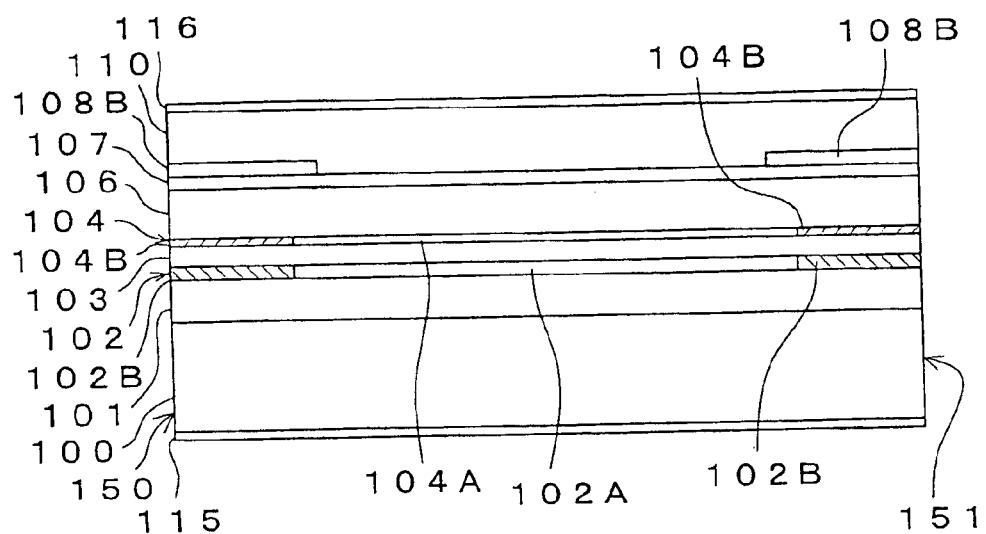
FIG. 2 is a sectional view taken along line II—II of FIG. 1.
Figure 3:
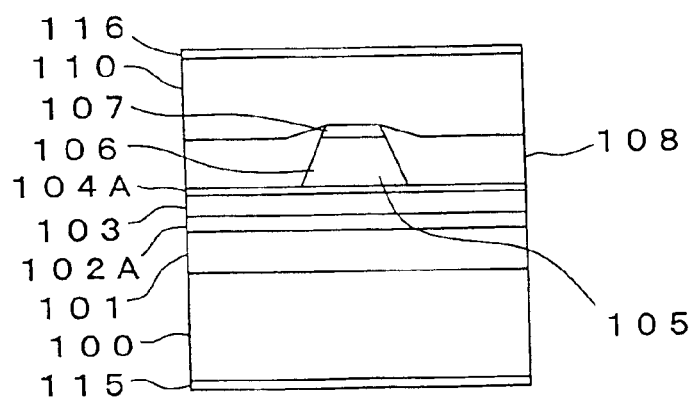
FIG. 3 is a sectional view taken along line III—III of FIG. 1.

FIG. 1 shows the device structure of an end-surface window type semiconductor laser of a first embodiment of the present invention. FIG. 2 shows a cross section taken along line II—II of FIG. 1, and FIG. 3 shows a cross section taken along line III—III of FIG. 1.

As shown in FIG. 1, an n-type AlGaInP lower cladding layer 101, an active layer 102 for generating laser light, a p-type AlGaInP first upper cladding layer 103 and a p-type GaInP etching stopper layer 104 are stacked in this order on an n-type GaAs substrate 100. The active layer 102 is formed by alternating undoped quantum well layers with barrier layers. A ridge 105, which extends in a stripe shape perpendicularly to light-emitting end surfaces 150 and 151, is constructed of a p-type AlGaInP second upper cladding layer 106 and a p-type GaAs cap layer 107. An n-type AlInP current blocking layer 108 is formed in regions at both sides of the ridge 105. As is apparent from FIG. 2, this current blocking layer 108 extends also over the ridge 105 (the extended portion is indicated by 108B) in regions located near the light-emitting end surfaces 150 and 151 and covers those portions 102B of the active layer 102 that are located near the light-emitting end surfaces 150 and 151. With this arrangement, a wattless current is prevented from being injected into the portions 102B of the active layer 102 adjacent to the light-emitting end surfaces 150 and 151. Moreover, as is apparent from FIGS. 2 and 3, the p-type GaAs cap layer 107 and a p-type GaAs contact layer 110 are in contact and electrically connected with each other in an internal region other than the regions located near the light-emitting end surfaces 150 and 151 with regard to the II—II direction.

In this semiconductor laser, regarding regions extending along the light-emitting end surfaces 150 and 151, the portions 102B of the active layer 102 that are located just under the ridge 105 have an energy bandgap greater than the energy bandgap of the other portions of the active layer 102 that are located in positions corresponding to both sides of the ridge 105. Thus, the portions 102B serve as window regions absorbing little laser light.

This semiconductor laser is fabricated as follows.

Figure 4A:
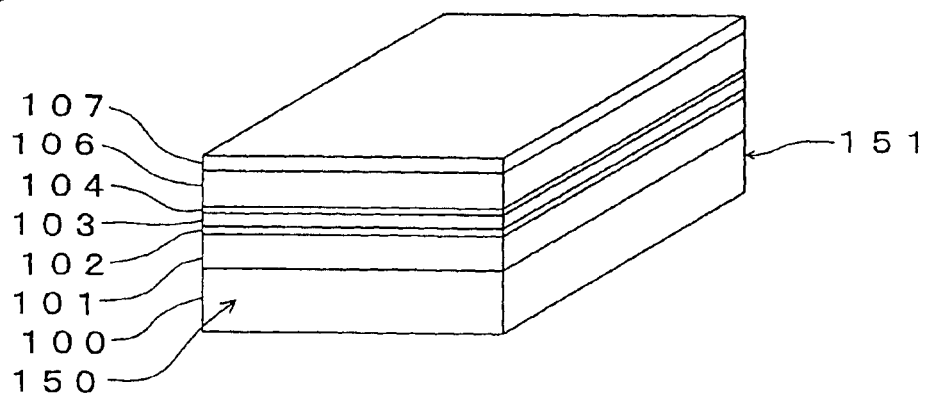
FIGS. 4A–4E are views for explaining the fabricating process steps for the semiconductor laser of the first embodiment of the present invention.

First of all, as shown in FIG. 4A, on an n-type GaAs substrate 100, there are formed by MBE (molecular beam epitaxy) an n-type $(Al_{0.7}Ga_{0.3})_{0.5}In_{0.5}P$ lower cladding layer 101 (having a carrier density of $1 \times 10^{18}$ cm$^{-3}$), an active layer 102 that has a structure in which three undoped GaInP layers (having a thickness of 6 nm) alternate with four undoped $(Al_{0.5}Ga_{0.5})_{0.5}In_{0.5}P$ layers (having a thickness of 8 nm) with one undoped GaInP layer being held between adjacent two undoped $(Al_{0.5}Ga_{0.5})_{0.5}In_{0.5}P$ layers, the p-type $(Al_{0.7}Ga_{0.3})_{0.5}In_{0.5}P$ first upper cladding layer 103 (having a carrier density of $1.5 \times 10^{18}$ cm$^{-3}$), a p-type $Ga_{0.6}In_{0.4}P$ etching stopper layer 104 (having a thickness of 6 nm and a carrier density of $1.5 \times 10^{18}$ cm$^{-3}$), a p-type $(Al_{0.7}Ga_{0.3})_{0.5}In_{0.5}P$ second upper cladding layer 106 (having a thickness of 0.2 μm and a carrier density of $2 \times 10^{18}$ cm$^{-3}$) and a p-type GaAs cap layer 107 (having a carrier density of $3 \times 10^{18}$ cm$^{-3}$) in this order. In this case, the n-type dopant is Si, and the p-type dopant is Be.

Figure 4B:
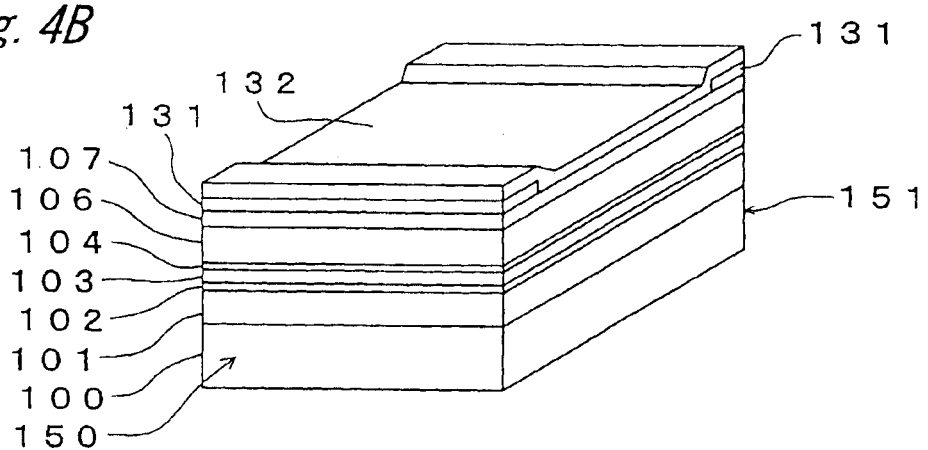

Next, as shown in FIG. 4B, a ZnO (zinc oxide) layer 131 having a thickness of 50 nm, which serves as an impurity diffusion source, is formed in a stripe shape on the cap layer 107 along the regions where the light-emitting end surfaces 150 and 151 are to be formed. Further, an $SiO_2$ (silicon oxide) layer 132 having a thickness of 200 nm is formed all over the substrate 100.

Next, annealing (first annealing) is carried out at a temperature of 510° C. for two hours, whereby Zn atoms are diffused from the ZnO (zinc oxide) layer 131 to the cap layer 107 and the second upper cladding layer 106 along the regions where the light-emitting end surfaces 150 and 151 are to be formed. Under this annealing condition, the p-type dopant, Be atoms, hardly diffuse in regions other than the regions located near the light-emitting end surfaces 150 and 151.

Figure 5:
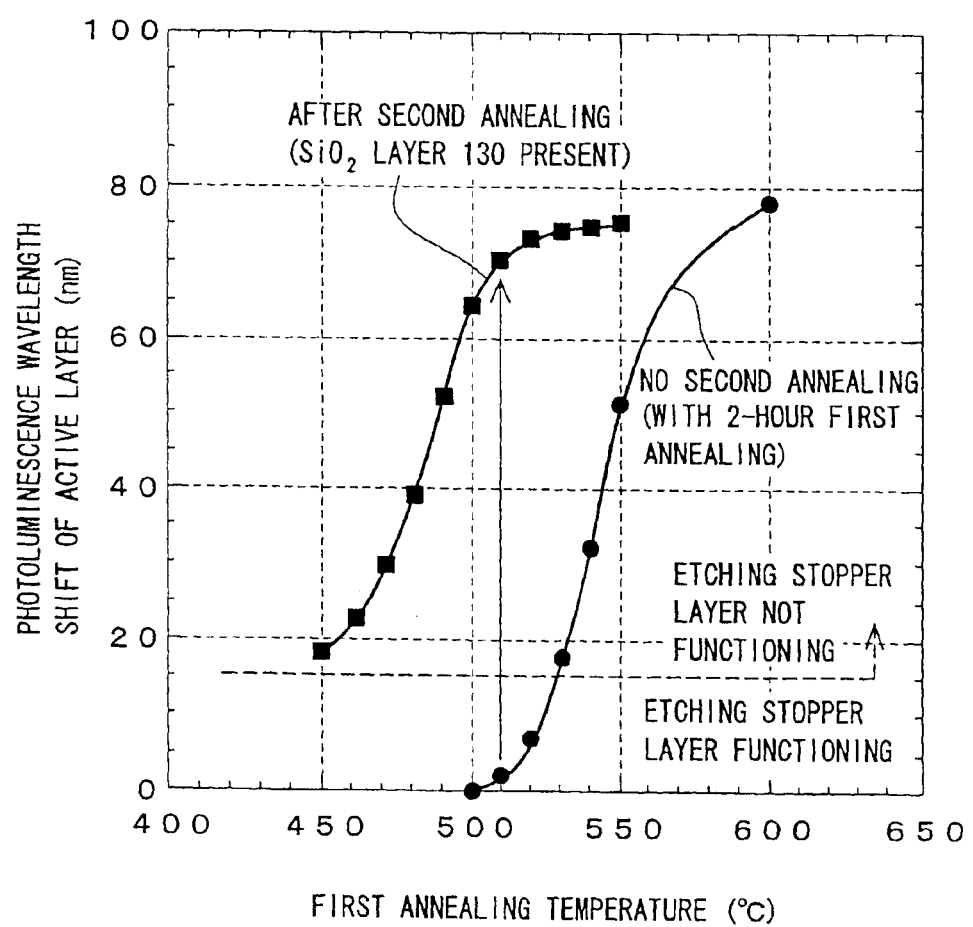
FIG. 5 is a graph showing the results of an active layer photoluminescence wavelength shift when a first annealing condition is changed.

What is important in this case is that no intermixing takes place in the etching stopper layer 104 and the active layer 102 through this first annealing process. For example, FIG. 5 shows the amount of the photoluminescence wavelength shift of the active layer (indicated by • in FIG. 5) when the temperature of the first annealing process is varied. It was confirmed that the photoluminescence wavelength of the active layer at the time of the end of the first annealing exhibited only a shift of 2 nm to the shorter wavelength side in comparison with the photoluminescence wavelength before the first annealing. Moreover, the function of the etching stopper layer 104 to stop etching in the etching process, which will be described below, was maintained normally when the amount of wavelength shift of the active layer 102 through this first annealing process was not greater than 15 nm. However, the function was lost when the amount of wavelength shift of the active layer 102 through this first annealing process exceeded 15 nm.

Figure 4C:
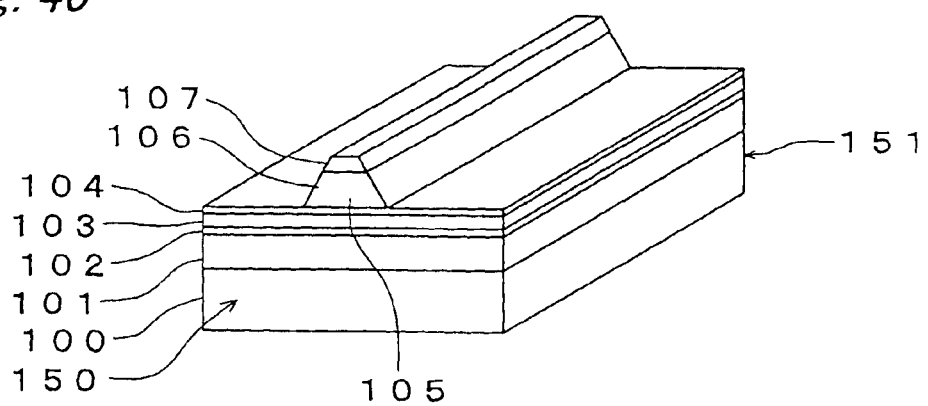

The $SiO_2$ layer 132 and the ZnO layer 131 are removed by buffered hydrofluoric acid, and thereafter, the cap layer 107 and the p-type upper cladding layer 103 are selectively etched by a mixed solution of sulfuric acid, hydrogen peroxide and water, and sulfuric acid, respectively, as shown in FIG. 4C, to thereby form a ridge 105, which is constructed of parts of the cap layer 107 and the p-type upper cladding layer 103, has a bottom width of 4 μm and extends in a stripe shape perpendicularly to the light-emitting end surfaces 150 and 151. In this etching process, the p-type etching stopper layer 104 is substantially not etched by sulfuric acid, and therefore, the p-type first upper cladding layer 103, which exists under the layer 104, is not etched.

Figure 4D:
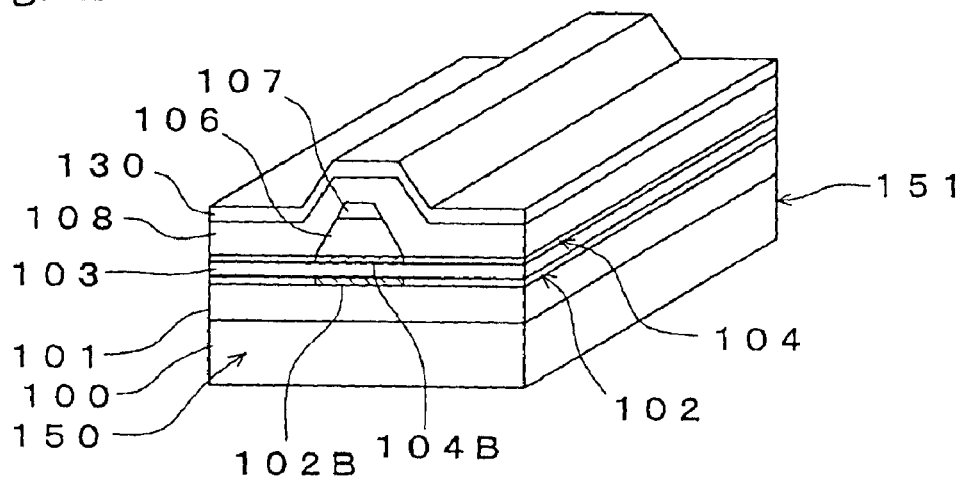

As shown in FIG. 4D, an n-type $Al_{0.5}In_{0.5}P$ current blocking layer 108 is formed in the whole region of the substrate 100 by the MBE method.

Subsequently, in order to prevent Zn atoms diffused in the ridge 105 from being discharged to the outside during the second annealing process described next, an $SiO_2$ (silicon oxide) layer 130, which has a thickness of 500 nm, is formed as an impurity evaporation preventing layer on the current blocking layer 108.

Subsequently, in a nitrogen ambient, annealing (second annealing) is carried out at a temperature of 680° C. for one hour. Through this process, the Zn atoms diffused in the regions of the ridge 105 in which the light-emitting end surfaces 150 and 151 are to be formed are again diffused now to the active layer 102 through the etching stopper layer 104, whereby local intermixing of the etching stopper layer 104 and the active layer 102 takes place at those portions 104B and 102B that extend along the light-emitting end surfaces 150 and 151 to be formed and are located just under the ridge 105. As shown in FIG. 5, it was confirmed that the photoluminescence wavelength of the intermixed portions 102B of the active layer 102 was shifted by 70 nm to the shorter wavelength side with respect to the non-intermixed inside part 102A of the active layer 102. After the completion of the semiconductor laser, the intermixed portions 102B each operate as a window region of a small quantity of laser light absorption at the light-emitting end surfaces to thereby restrain the COD (Catastrophic Optical Damage). Under this annealing condition, the Be atoms used as a p-type dopant scarcely diffuse into regions other than the regions located near the light-emitting end surfaces 150 and 151.

Figure 4E:
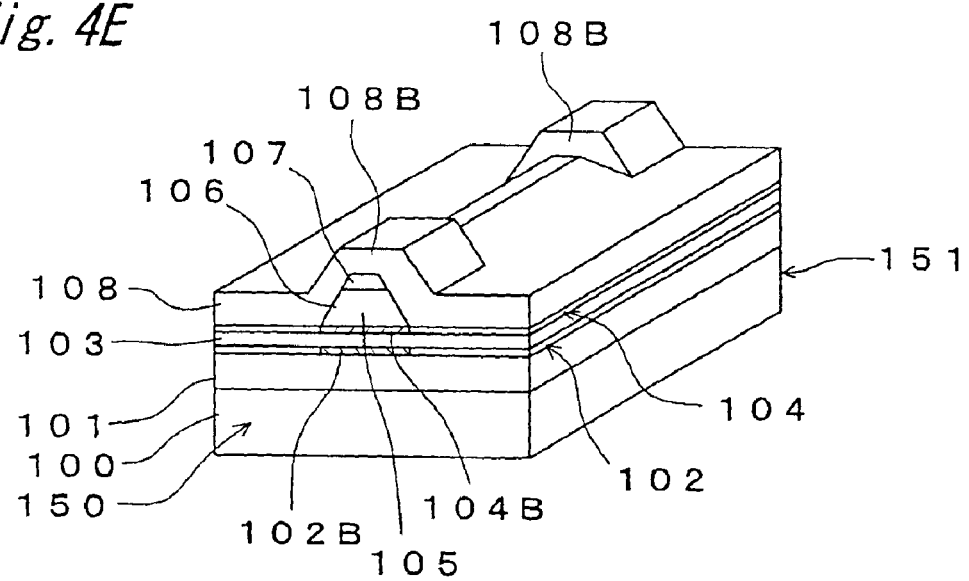

As shown in FIG. 4E, the $SiO_2$ layer 130 is removed by buffered hydrofluoric acid. Then, a portion that exists on the ridge 105 and in a region other than the regions near the light-emitting end surfaces 150 and 151 is removed from the n-type $Al_{0.5}In_{0.5}P$ current blocking layer 108. That is, of all the parts of the n-type $Al_{0.5}In_{0.5}P$ current blocking layer 108 on the substrate 100, parts 108B that exist in the regions located near the light-emitting end surfaces 150 and 151 as well as parts (indicated by 108) existing at both sides of the ridge 105 are left intact.

Subsequently, as shown in FIG. 1, a p-type GaAs contact layer 110 (having a thickness of 4 μm) is formed over the substrate 100, and electrodes 115 and 116 are further formed on the lower and upper surfaces, respectively, of the wafer (completion of the wafer fabrication). Subsequently, the wafer is cleaved along the regions where the light-emitting end surfaces 150 and 151 are to be formed, i.e., in a manner that the intermixed portions 102B of the active layer 102 define resonator end surfaces. Then, coating is performed so that the one end surface 150 comes to have a reflectance of 8% and the end surface 151 located on the opposite side comes to have a reflectance 91%, as light-emitting end surfaces (completion of the laser chip fabrication). The resonator length was set to 800 μm, and the length of the intermixed portion 102B of the active layer 102 was set to 25 μm at both of the opposite light-emitting end surfaces 150 and 151.

Each laser chip was mounted on a stem, and the characteristics were examined with a current applied. A maximum optical output of 265 mW was obtained at a wavelength of 654 nm and it was confirmed that the COD was not generated. Moreover, a leak current, which might be generated if the etching stopper layer was destroyed in the etching stage, was not observed.

Figure 8:
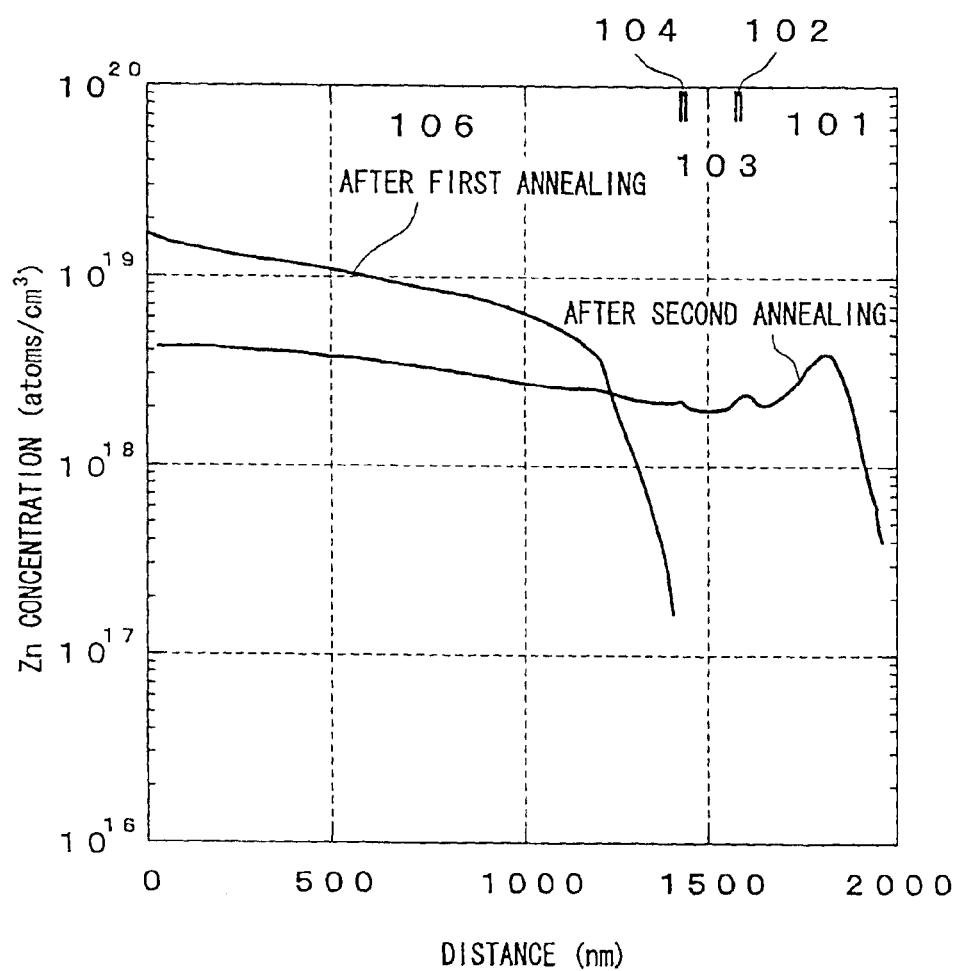
FIG. 8 is a graph showing a Zn concentration profile in the direction of depth of a ridge portion in the first embodiment.

In order to prove this effect, a Zn concentration profile in the direction of depth in the region where the ridge 105 exists was measured by SIMS (secondary ion mass spectrometry). The width of the ridge 105 was set to 500 μm for the sake of convenience of the SIMS analysis. FIG. 8 shows the Zn concentration profiles obtained after the first annealing at a temperature of 510° C. for two hours and the second annealing. FIG. 8 indicates that Zn atoms do not reach the etching stopper layer 104 when the first annealing ends, and that Zn atoms diffuse beyond the active layer 102 after the second annealing ends.

FIG. 5 and FIG. 3 show the results of the photoluminescence wavelength shift of the active layer under the conditions such as annealing conditions and so on of the present embodiment. In this case, due to the fact that the photoluminescence of the active layer is more easily measured than the photoluminescence of the etching stopper layer and the fact that the active layer and the etching stopper layer are intermixed to the same extent since the layers are separated apart by only a distance of 0.2 μm that is the thickness of the first upper cladding layer, the function of the etching stopper layer is evaluated through the photoluminescence of the active layer. A broken line is drawn at a critical active layer photoluminescence wavelength shift value of 15 nm. The etching stopper layer 104 has the function to stop the etching when the wavelength shift is not greater than the value of 15 nm, and the etching stopper layer 104 does not have the function to stop the etching when the wavelength shift exceeds 15 nm. As shown in FIG. 5, when the $SiO_2$ layer 130 is provided as an impurity evaporation preventing layer, the wavelength shift is largely increased after the second annealing than after the first annealing. It can be understood that the wavelength shift becomes 18 nm or more after the second annealing when the first annealing temperature is not lower than 450° C.

Figure 6:
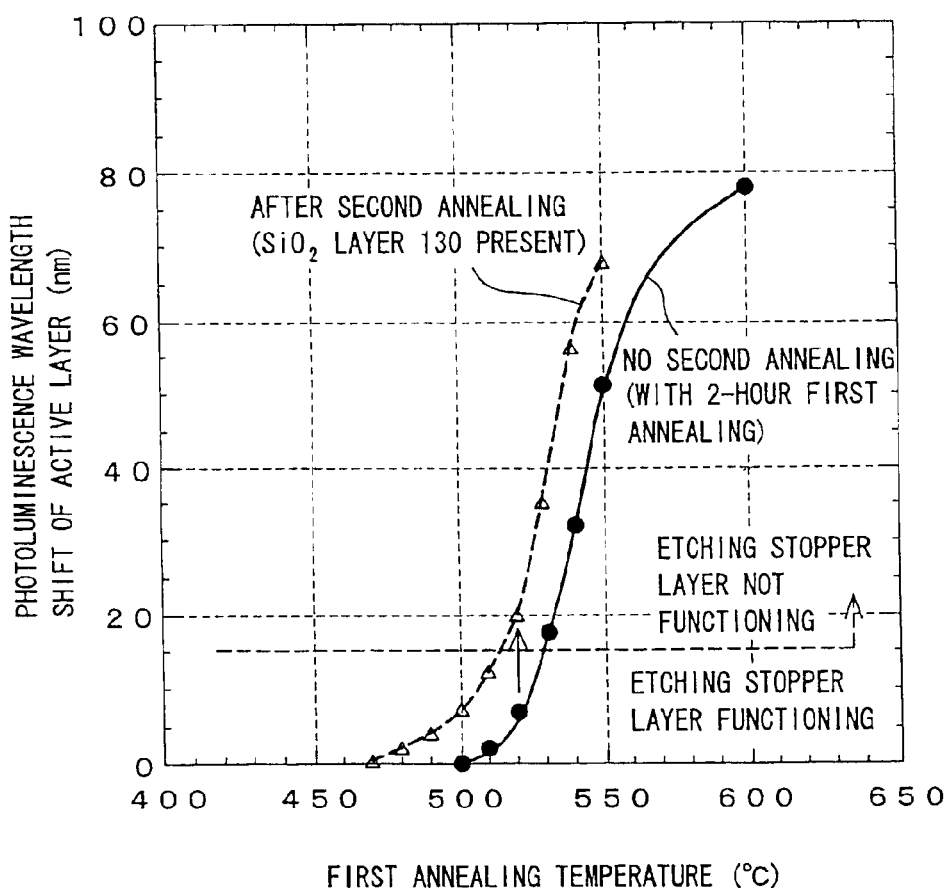
FIG. 6 is a graph showing the results of the active layer photoluminescence wavelength shift when the first annealing condition is changed.
Figure 9:
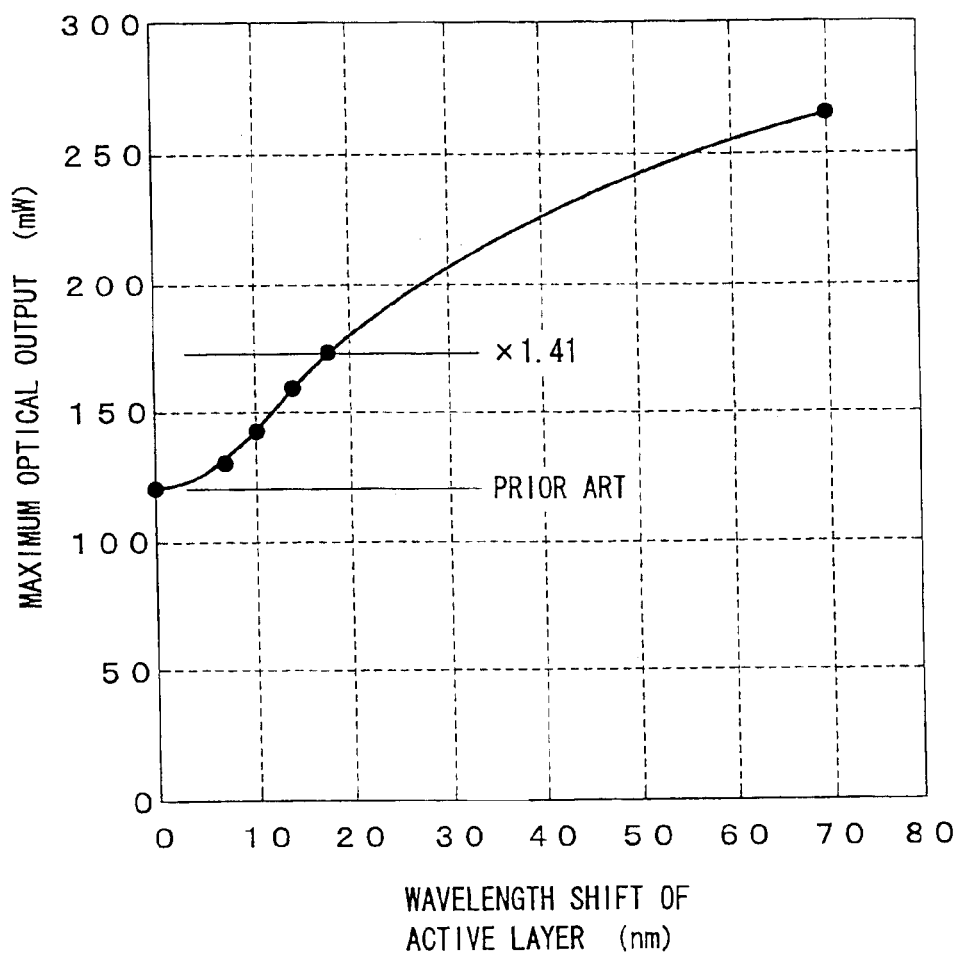
FIG. 9 is an explanatory view showing the relationship between the amount of wavelength shift of the active layer and the maximum optical output of the semiconductor laser of the first embodiment.

On the other hand, as shown in FIG. 6, when the $SiO_2$ layer 130 as an impurity evaporation preventing layer is not provided, the wavelength shift slightly increases even after the second annealing than after the first annealing. It can be understood that a wavelength shift amount of 18 nm of the active layer is obtained with the function of the etching stopper layer maintained when the first annealing temperature is set at, for example, 520° C. According to this fact, with the annealing temperature and time set at 520° C. and two hours as the first annealing conditions, a comparative example having no $SiO_2$ layer 130 as an impurity evaporation preventing layer was fabricated. In this case, the photoluminescence wavelength of the active layer became 18 nm after the second annealing, and the COD took place at a maximum optical output of 174 mW. However, it was confirmed that the maximum optical output was improved in comparison with the case where no window layer was provided (in which case maximum optical output is 120 mW). FIG. 9 shows a relation between the amount of wavelength shift of the active layer and the maximum optical output. The semiconductor laser of the present embodiment is intended mainly to increase the writing speed to DVD-R and DVD-RW of the next generation. Because it is required to double the writing speed every generation, the optical output of the corresponding semiconductor laser should be increased to 1.41 times that of the conventional device. FIG. 9 indicates that this requirement is satisfied when the amount of wavelength shift is not smaller than 18 nm.

Although the $SiO_2$ layer 130 is adopted as the impurity evaporation preventing layer in the present embodiment, the present invention is not limited to this. Silicon nitride or alumina can also be adopted as the impurity evaporation preventing layer. These materials can suitably be used as a fine or dense masking material for preventing Zn from evaporating to the outside, similarly to $SiO_2$. Semiconductor lasers were actually fabricated by adopting each of silicon nitride and alumina for the impurity evaporation preventing layer. The amount of wavelength shift after the second annealing was 75 nm in the case of silicon nitride and 73 nm in the case of alumina. Moreover, similarly to $SiO_2$, the silicon nitride and alumina can be removed with hydrofluoric acid or the like without etching the compound semiconductor underlayer.

Moreover, the p-type dopant was provided by Be in the present embodiment. However, even by employing another dopant of a small diffusion coefficient, in particular, C, satisfactory device characteristics (laser oscillation threshold value, etc.) can be obtained with the diffusion of the p-type dopant into the active layer restrained.

Moreover, sulfuric acid was used as an etchant for the second upper cladding layer in the present embodiment. However, even phosphoric acid or hydrochloric acid, which etch the second upper cladding layer but hardly etch the etching stopper layer (etching rates of the two layers are different by ten times or more), is therefore able to be preferably used.

Moreover, although an ordinary annealing furnace was used for the annealing process in the present embodiment, an RTA (rapid thermal annealing) furnace can also be used. RTA means annealing with an extremely rapid temperature increase of 10° C./sec. to 100° C./sec. In this case, it is proper to set a temperature retention time at about 20 seconds to 10 minutes. Since the retention time is short, it is required to raise the temperature higher than the normal annealing temperature.

Figure 7:
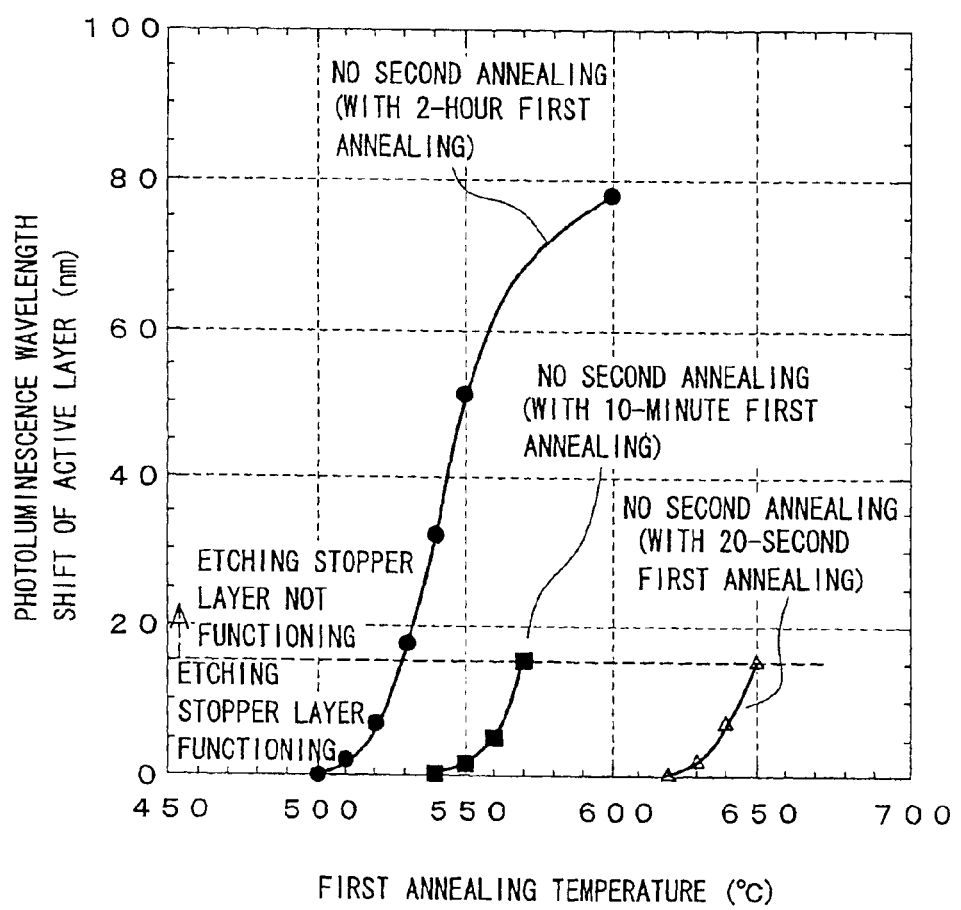
FIG. 7 is a graph showing the results of the active layer photoluminescence wavelength shift when the first annealing condition is changed.

FIG. 7 shows the results of the photoluminescence wavelength shift of the active layer when the first annealing time is changed to 10 minutes and to 20 seconds. It can be understood that the wavelength shift becomes 15 nm or less at a first annealing temperature of not higher than 570° C. when the first annealing time is 10 minutes. When the temperature retention time is 20 seconds, it is proper to carry out the first annealing at a temperature of 550° C. to 650° C. and carry out the second annealing at a temperature of 650° C. to 850° C. RTA, which has the advantage that the working hours are short, can appropriately be used if attention is paid to the temperature uniformity.

(Second Embodiment)

Figure 10:
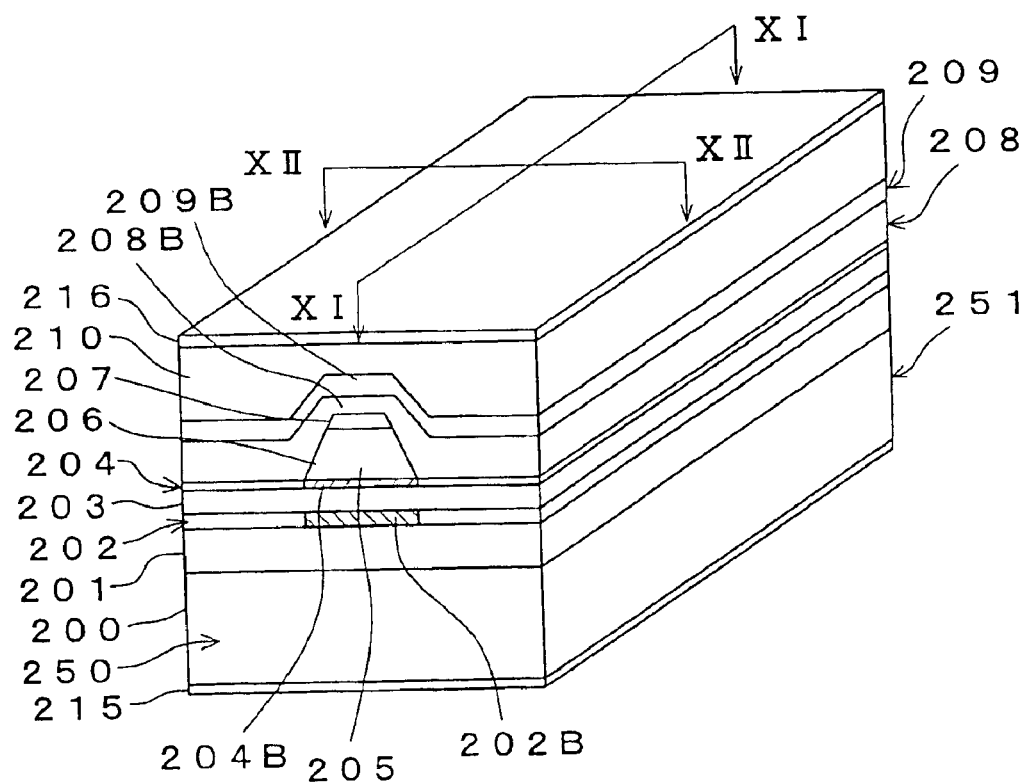
FIG. 10 is a perspective view of a semiconductor laser according to a second embodiment of the present invention.
Figure 11:
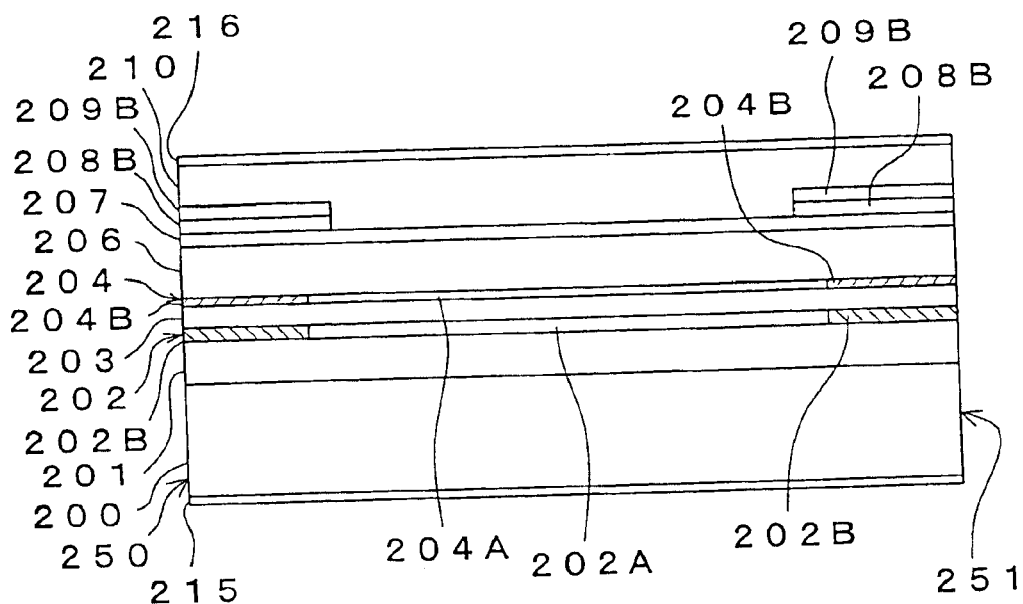
FIG. 11 is a sectional view taken along line XI—XI of FIG. 10.
Figure 12:
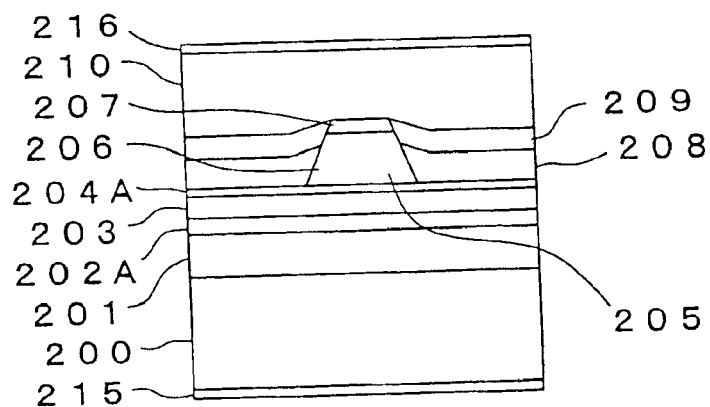
FIG. 12 is a sectional view taken along line XII—XII of FIG. 10.

FIG. 10 shows the device structure of an end-surface window type semiconductor laser of the second embodiment. FIG. 11 shows a cross section taken along the line XI—XI of FIG. 10, and FIG. 12 shows a cross section taken along the line XII—XII of FIG. 10.

As shown in FIG. 10, a lower cladding layer 201, an active layer 202 for generating laser light, a first upper cladding layer 203 and an etching stopper layer 204 are stacked in this order on an n-type GaAs substrate 200. The active layer 202 is formed by alternating undoped quantum well layers and barrier layers. A ridge 205, which extends in a stripe shape perpendicularly to light-emitting end surfaces 250 and 251, is constructed of a second upper cladding layer 206 and a p-type GaAs cap layer 207. An n-type AlInP current blocking layer 208 and an n-type GaAs current blocking layer 209 are formed in regions at both sides of the ridge 205. As is apparent from FIG. 11, these current blocking layers 208 and 209 extend also over the ridge 205 (the extended portions are indicated by 208B and 209B) in regions located near the light-emitting end surfaces 250 and 251 and cover those portions 202B of the active layer 202 that are located near the light-emitting end surfaces 250 and 251. With this arrangement, a wattless current is prevented from being injected into the portions 202B of the active layer 202 that are located near the light-emitting end surfaces 250 and 251. Moreover, as is apparent from FIGS. 11 and 12, with regard to the XI—XI direction, the p-type GaAs cap layer 207 and a p-type GaAs contact layer 210 are in contact and electrically connected with each other in an internal region other than the regions located near the light-emitting end surfaces 250 and 251.

In this semiconductor laser, regarding regions extending along the light-emitting end surfaces 250 and 251, the portions 202B of the active layer 202 that are located just under the ridge 205 have an energy bandgap greater than the energy bandgap of the other portions of the active layer 202 that are located in positions corresponding to both sides of the ridge 205. Thus, the portions 202B serve as window regions absorbing little laser light. The portions 202B are formed by diffusing the diffused impurity, which has been contained in the second upper cladding layer 206 of the ridge 205, as described later. Therefore, in the active layer 202, the bandgap becomes gradually reduced away from the ridge 205. The light density of the laser light is also gradually reduced away from the ridge 205, and this is advantageous from the viewpoint of restriction of photoabsorption.

This semiconductor laser is fabricated as follows.

Figure 13A:
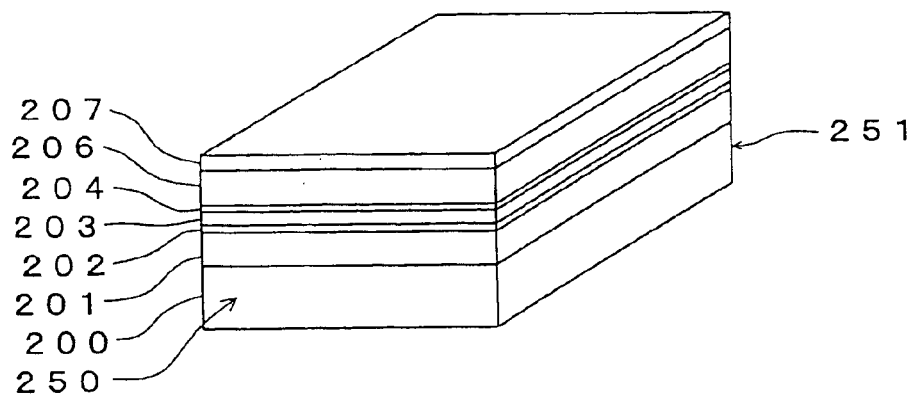
FIGS. 13A–13E are views showing the fabricating process steps for the semiconductor laser of the second embodiment of the present invention.

First of all, as shown in FIG. 13A, on the n-type GaAs substrate 200, there are formed by the MOCVD method (metal-organic chemical vapor deposition method) an n-type $(Al_{0.7}Ga_{0.3})_{0.5}In_{0.5}P$ lower cladding layer 201 (having a carrier density of $1\times10^{18}$ cm$^{-3}$), an active layer 202 that has a structure in which three undoped GaInP layers (having a thickness of 6 nm) alternate with four undoped $(Al_{0.5}Ga_{0.5})_{0.5}In_{0.5}P$ layers (having a thickness of 8 nm) with one undoped GaInP layer being held between adjacent $(Al_{0.5}Ga_{0.5})_{0.5}In_{0.5}P$ layers, a p-type $(Al_{0.7}Ga_{0.3})_{0.5}In_{0.5}P$ first upper cladding layer 203 (having a carrier density of $0.7\times10^{18}$ cm$^{-3}$), a p-type $Ga_{0.6}In_{0.4}P$ etching stopper layer 204 (having a carrier density of $1.5\times10^-$cm$^{-3}$), a p-type $(Al_{0.7}Ga_{0.3})_{0.5}In_{0.5}P$ second upper cladding layer 206 (having a carrier density of $2\times10^{18}$ cm$^{-3}$) and a p-type GaAs cap layer 207 (having a carrier density of $3\times10^{18}$ cm$^{-3}$) in this order. In this case, the n-type dopant is Si, and the p-type dopant is C for the first upper cladding layer and Zn for the other p-type layers.

Figure 13B:
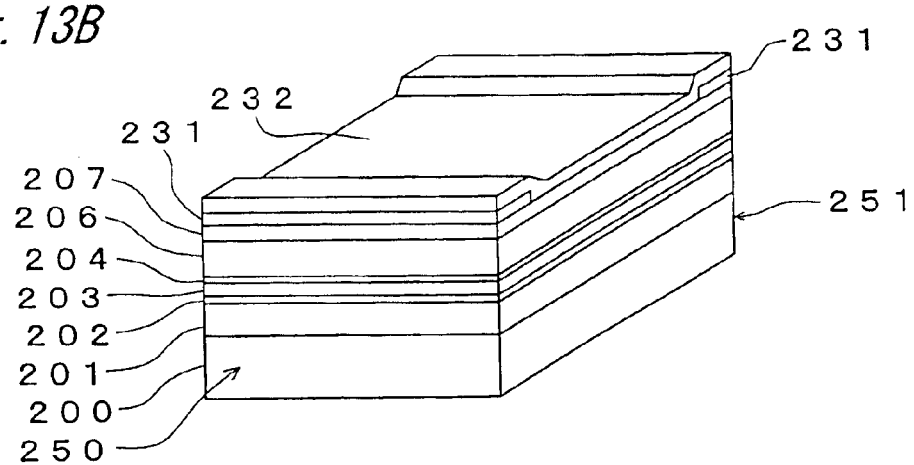

Next, as shown in FIG. 13B, a ZnO (zinc oxide) layer 231 having a thickness of 50 nm, which serves as an impurity diffusion source, is formed in a stripe shape on the cap layer 207 along the regions where the light-emitting end surfaces 250 and 251 are to be formed. Further, an SiO$_2$ (silicon oxide) layer 232 having a thickness of 200 nm is formed in the whole region on the substrate 200.

Next, annealing (first annealing) is carried out at a temperature of 510° C. for two hours, whereby Zn atoms are diffused from the ZnO (zinc oxide) layer 231 to the cap layer 207 and the second upper cladding layer 206 along the regions where the light-emitting end surfaces 250 and 251 are to be formed. What is important in this case is that neither the GaInP etching stopper layer 204 nor the active layer 202 is intermixed with Zn atoms through this first annealing process.

Figure 13C:
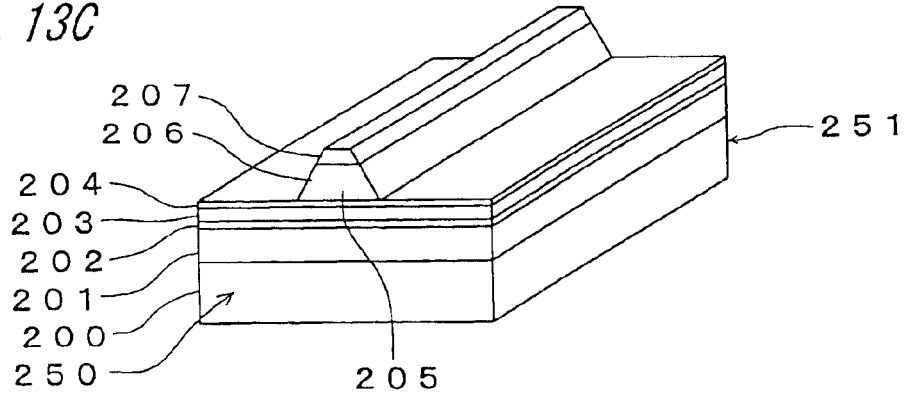

The SiO$_2$ layer 232 and the ZnO layer 231 are removed by buffered hydrofluoric acid, and thereafter, the cap layer 207 and the p-type upper cladding layer 203 are selectively etched by a mixed solution of sulfuric acid, hydrogen peroxide and water, and sulfuric acid, respectively, as shown in FIG. 13C, to thereby form a ridge 205, which is constructed of parts of the cap layer 207 and the p-type upper cladding layer 203, has a bottom width of 3 μm and extends in a stripe shape perpendicularly to the light-emitting end surfaces 250 and 251. In this etching process, the p-type etching stopper layer 204 is substantially not etched by sulfuric acid, and therefore, the p-type first upper cladding layer 203, which exists under the layer 204, is not etched, either.

Figure 13D:
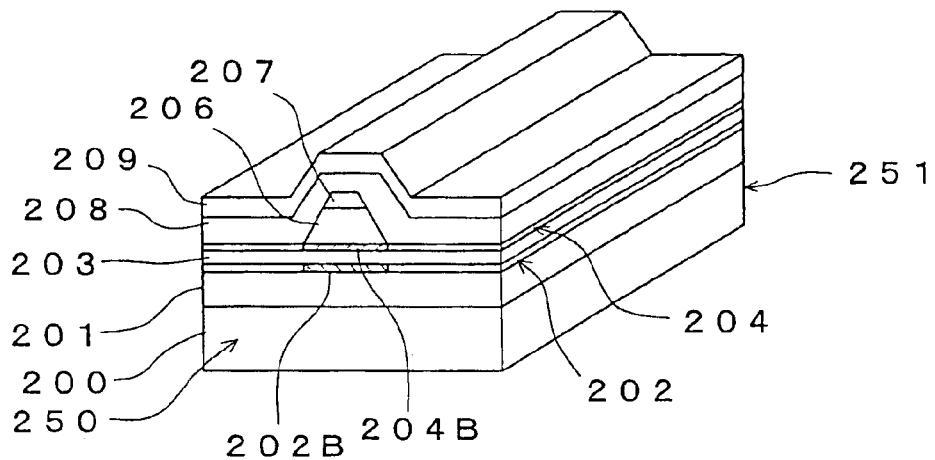
Figure 13E:
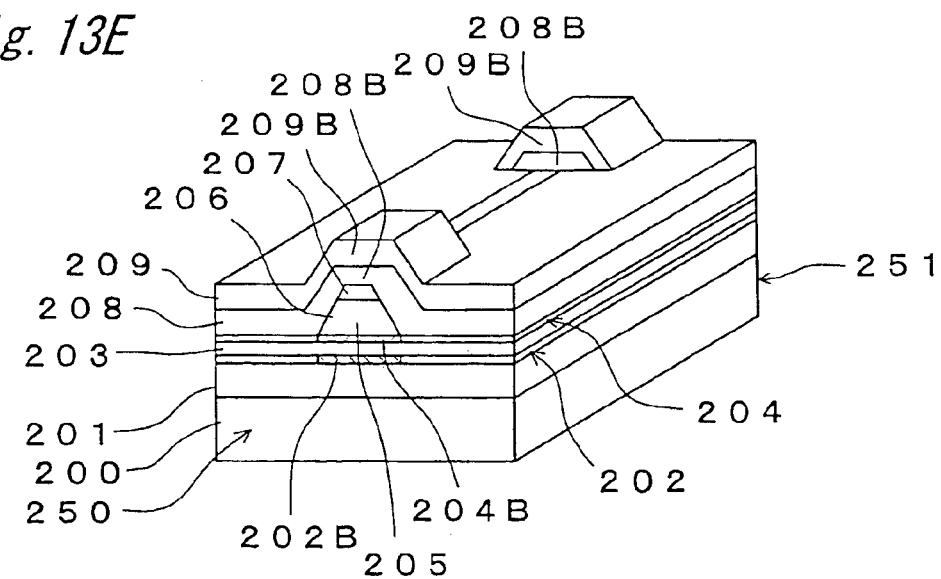

As shown in FIG. 13D, an n-type $Al_{0.5}In_{0.5}P$ current blocking layer 208 (0.6 μm) and an n-type GaAs current blocking layer 209 (2.0 μm) are formed in this order over the substrate 200 by the MBE method.

In this case, the n-type $Al_{0.5}In_{0.5}P$ current blocking layer 208 is grown at a substrate temperature of 490° C. and also functions as an impurity evaporation preventing layer for preventing the impurity diffusion to the outside. Moreover, in growing the n-type GaAs current blocking layer 209, the substrate temperature is set at 490° C. at the start of growth of the n-type GaAs layer, and is raised up to 630° C. after the n-type GaAs layer has been grown by about 0.2 μm. By thus raising the substrate temperature to 630° C., the Zn atoms diffused in the regions of the ridge 205 in which the light-emitting end surfaces 250 and 251 are to be formed are again diffused now to the active layer 202 through the etching stopper layer 204, whereby local intermixing of the etching stopper layer 204 and the active layer 202 takes place at those portions 204B and 202B that extend along the light-emitting end surfaces 250 and 251 to be formed and are located just under the ridge 205. It was confirmed that the photoluminescence wavelength of the intermixed portions 202B of the active layer 202 was actually shifted by 45 nm to the shorter wavelength side with respect to the inside 202A where no intermixing took place. After the completion of the semiconductor laser, the intermixed portions 202B each operate as a window region of a small quantity of laser light absorption at the light-emitting end surfaces to thereby restrain the COD.

As shown in FIG. 15B, portions that exist on the ridge 205 and in regions other than the regions near the light-emitting end surfaces 250 and 251 are removed from the n-type GaAs current blocking layer 209 and the n-type $Al_{0.5}In_{0.5}P$ current blocking layer 208. That is, of all portions of the n-type GaAs current blocking layer 209 and the n-type $Al_{0.5}In_{0.5}P$ current blocking layer 208 on the substrate 100, portions 209B, 208B that exist in the regions located near the light-emitting end surfaces 250 and 251 as well as portions (indicated by 209, 208) existing at both sides of the ridge 205 are left intact.

Subsequently, as shown in FIG. 11, a p-type GaAs contact layer 210 (having a thickness of 4 μm) is formed over the substrate 200, and electrodes 215 and 216 are further formed on the lower and upper surfaces, respectively, of the wafer (completion of the wafer fabrication). Subsequently, the wafer is cleaved along the regions where the light-emitting end surfaces 250 and 251 are to be formed, i.e., in a manner that the portions 202B of the active layer 202 in which intermixing took place define resonator end surfaces. Then, coating is performed so that the one end surface 250 comes to have a reflectance of 8% and the end surface 251 located on the opposite side comes to have a reflectance of 91%, as light-emitting end surfaces (completion of the laser chip fabrication). The length of the intermixed portion 202B of the active layer 202 is 20 μm at both of the light-emitting end surface 250 and the end surface 251 located on the opposite side.

Each laser chip was mounted on a stem, and the characteristics were examined with a current applied. A maximum optical output of 225 mW was obtained at a wavelength of 656 nm and it was confirmed that the COD was not generated. Moreover, a leak current, which might be generated if the etching stopper layer was destroyed in the etching stage, was not observed.

In the present embodiment, the n-type $Al_{0.5}In_{0.5}P$ current blocking layer 208 was first formed at a comparatively low temperature, and then the n-type GaAs current blocking layer 209 was formed at the substrate temperature for the second annealing. However, the substrate temperature for the second annealing may be provided at some point during the formation of the n-type $Al_{0.5}In_{0.5}P$ current blocking layer 208. By thus performing the second annealing utilizing the substrate temperature in the current blocking layer forming stage, the fabricating process can be simplified than in the first embodiment. As a current blocking layer forming method, it is acceptable to use the MOCVD method besides the MBE method.

(Third Embodiment)

Figure 14:
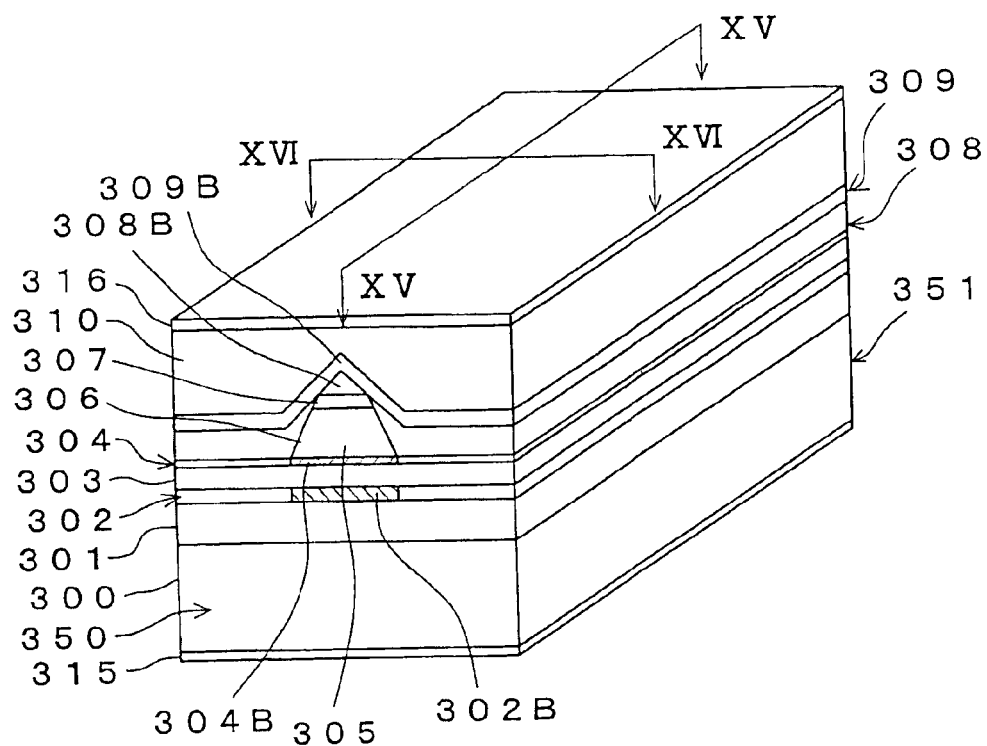
FIG. 14 is a perspective view of a semiconductor laser according to a third embodiment of the present invention.
Figure 15:
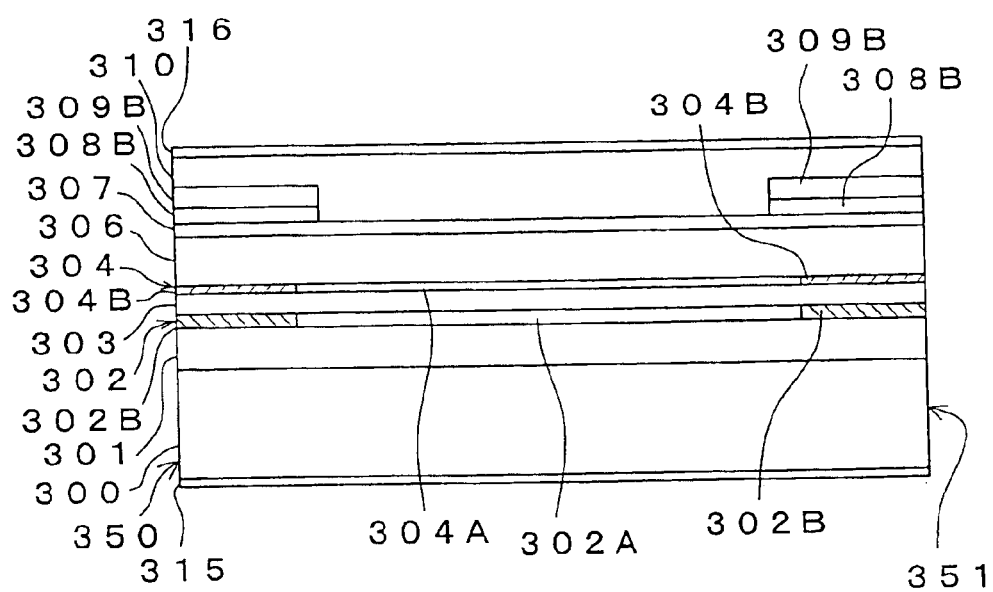
FIG. 15 is a sectional view taken along line XV—XV of FIG. 14.
Figure 16:
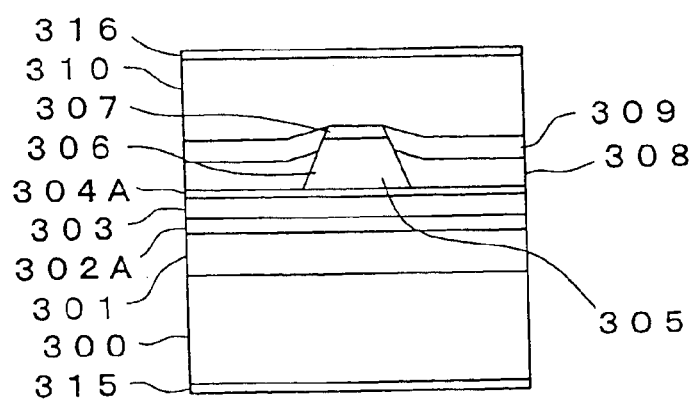
FIG. 16 is a sectional view taken along line XVI—XVI of FIG. 14.

FIG. 14 shows the device structure of an end-surface window type semiconductor laser according to a third embodiment of the present invention. FIG. 15 shows a cross section taken along the line XV–XV of FIG. 14, and FIG. 16 shows a cross section taken along the line XVI—XVI of FIG. 14.

As shown in FIG. 14, an n-type AlGaAs lower cladding layer 301, an active layer 302 for generating laser light, a p-type AlGaAs first upper cladding layer 303, a p-type GaAs etching stopper layer 304 (having a thickness of 3 nm) are stacked in this order on an n-type GaAs substrate 300. The active layer 302 is formed by alternating undoped quantum well layers and barrier layers. A ridge 305, which extends in a stripe shape perpendicularly to light-emitting end surfaces 350 and 351, is constructed of a p-type AlGaAs second upper cladding layer 306 and a p-type GaAs cap layer 307. An n-type AlGaAs current blocking layer 308 is formed in regions on both sides of the ridge 305. As is apparent from FIG. 15, this current blocking layer 308 exists together with a p-type GaAs layer 309 also on the ridge 305 in the regions located near the light-emitting end surfaces 350 and 351 (these portions are indicated by 308B and 308B) and covers those portions 302B of the active layer 302 that are located near the light-emitting end surfaces 350 and 351. With this arrangement, a wattless current is prevented from being injected into the portions 302B of the active layer 302 that are located near the light-emitting end surfaces 350 and 351. Moreover, as is apparent from FIGS. 15 and 16, the p-type GaAs cap layer 307 and the p-type GaAs contact layer 310 are in contact and electrically connected with each other in an internal region other than the regions located near the light-emitting end surfaces 350 and 351 with regard to the XV—XV direction.

In this semiconductor laser, regarding regions of the active layer 302 extending along the light-emitting end surfaces 350 and 351, the portions 302B of the active layer 302 that are located just under the ridge 305 have an energy bandgap greater than the energy bandgap of the other portions of the active layer 302 that are located in positions corresponding to both sides of the ridge 305. Thus, the portions 302B serve as window regions absorbing little laser light.

This semiconductor laser is fabricated as follows.

Figure 17A:
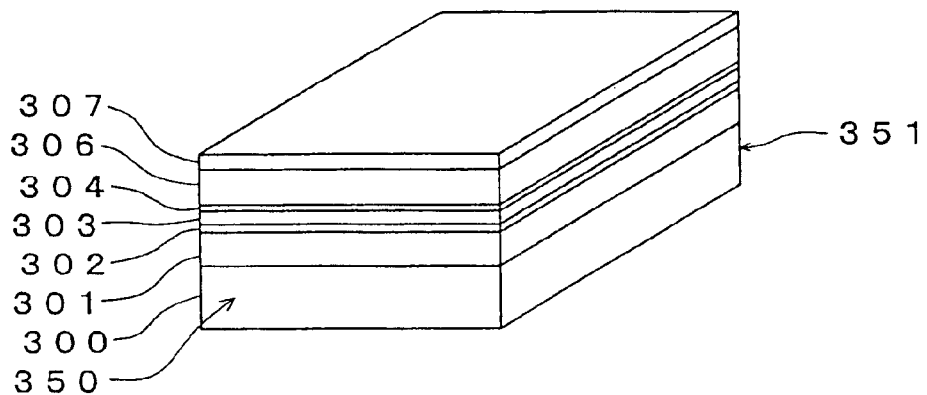
FIGS. 17A–17E are views showing the fabricating process steps for the semiconductor laser of the third embodiment of the present invention.

First of all, as shown in FIG. 17A, on an n-type GaAs substrate 300, there are formed by the MBE method an n-type $Al_{0.5}Ga_{0.5}As$ lower cladding layer 301 (having a carrier density of $1\times10^{18}$ $cm^{-3}$), an active layer 302 that has a structure in which two undoped GaAs layers (having a thickness of 10 nm) alternate with three undoped $Al_{0.3}Ga_{0.7}As$ layers (having a thickness of 8 nm) with one undoped GaAs layer being held between adjacent two undoped $Al_{0.3}Ga_{0.7}As$ layers, a p-type $Al_{0.5}Ga_{0.5}As$ first upper cladding layer 303 (having a carrier density of $1.0\times10^{18}$ $cm^{-3}$), a p-type GaAs etching stopper layer 304 (having a carrier density of $2.0\times10^{18}$ $cm^{-3}$), a p-type $Al_{0.5}Ga_{0.5}As$ second upper cladding layer 306 (having a carrier density of $2.5\times10^{18}$ $cm^{-3}$) and a p-type GaAs cap layer 307 (having a carrier density of $3\times10^{18}$ $cm^{-3}$) in this order. In this case, the n-type dopant is Si, and the p-type dopant is Be.

Figure 17B:
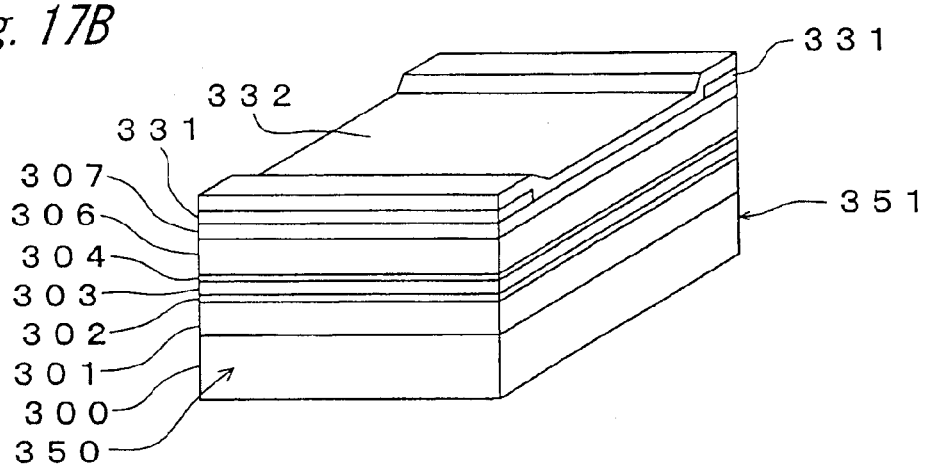

Next, as shown in FIG. 17B, a ZnO (zinc oxide) layer 331 having a thickness of 50 nm, which serves as an impurity diffusion source, is formed in a stripe shape along the regions where the light-emitting end surfaces 350 and 351 are to be formed. Further, an $SiO_2$ (silicon oxide) layer 332 having a thickness of 200 nm is formed in the whole region on the substrate 300.

Next, annealing (first annealing) is carried out at a temperature of 680° C. for two hours, so that Zn atoms are diffused from the ZnO (zinc oxide) layer 331 to the cap layer 307 and the second upper cladding layer 306 along the regions where the light-emitting end surfaces 350 and 351 are to be formed. Under this annealing condition, Be atoms, used as a p-type dopant, hardly diffuse in regions other than the regions located near the light-emitting end surfaces 350 and 351.

Figure 17C:
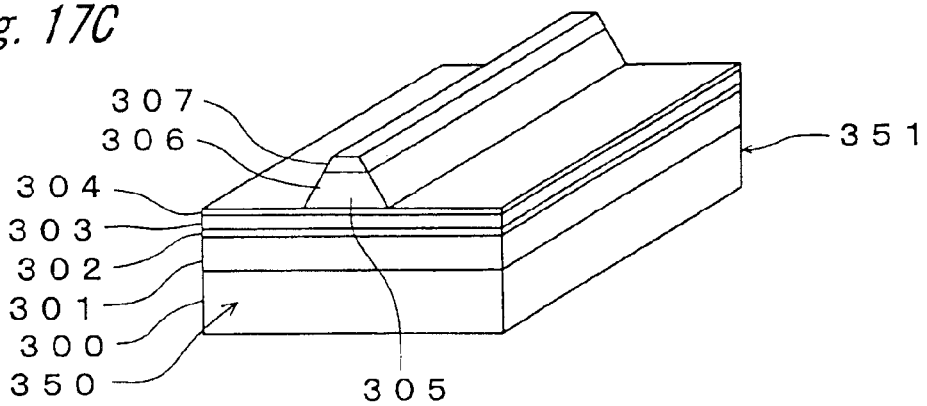

The $SiO_2$ layer 332 and the ZnO layer 331 are removed by buffered hydrofluoric acid, and thereafter, the cap layer 307 and the p-type upper cladding layer 303 are selectively etched by a mixed solution of sulfuric acid, hydrogen peroxide solution and water, and sulfuric acid, respectively, as shown in FIG. 17C, to thereby form a ridge 305 from parts of the cap layer 307 and the p-type upper cladding layer 303, the ridge 305 having a bottom width of 4 μm and extending in a stripe shape perpendicularly to the light-emitting end surfaces 350 and 351. In this etching process, the p-type etching stopper layer 304 is substantially not etched by sulfuric acid, and therefore, the p-type first upper cladding layer 303, which exists under the layer 304, is not etched, either.

Figure 17D:
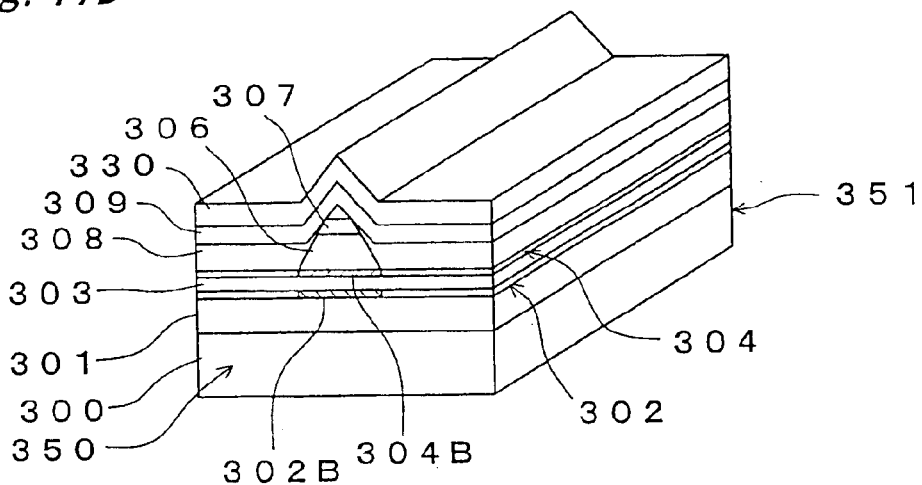

As shown in FIG. 17D, an n-type $Al_{0.7}Ga_{0.3}As$ current blocking layer 308 and a p-type GaAs layer 309 are formed on both sides of the ridge 305 by the MOCVD method. These layers also cover the upper portion of the ridge 305.

Subsequently, in order to prevent the Zn atoms diffused in the ridge 305 from being discharged to the outside during the second annealing process described next, an $SiO_2$ (silicon oxide) layer 330, which has a thickness of 500 nm, is formed as an impurity evaporation preventing layer on the p-type GaAs layer 309.

Subsequently, in an nitrogen ambient, RTA (second annealing) is carried out at a temperature of 950° C. for one minute. Through this process, the Zn atoms diffused in those regions of the ridge 305 that are to form the light-emitting end surfaces 350 and 351, are diffused again to the active layer 302 through the etching stopper layer 304, whereby local intermixing of the etching stopper layer 304 and the active layer 302 takes place at those portions 304B and 302B that extend along the light-emitting end surfaces 350 and 351 to be formed and are located just under the ridge 305. After the completion of the semiconductor laser, the intermixed portions 302B each operate as a window region at the light-emitting end surfaces absorbing little laser light to thereby restrain the COD. Under this annealing condition, Be atoms used as a p-type dopant scarcely diffuse into regions other than the regions located near the light-emitting end surfaces 350 and 351. Accordingly, there is little possibility of raising the laser oscillation threshold due to the Be atoms reaching the active layer 302.

Figure 17E:
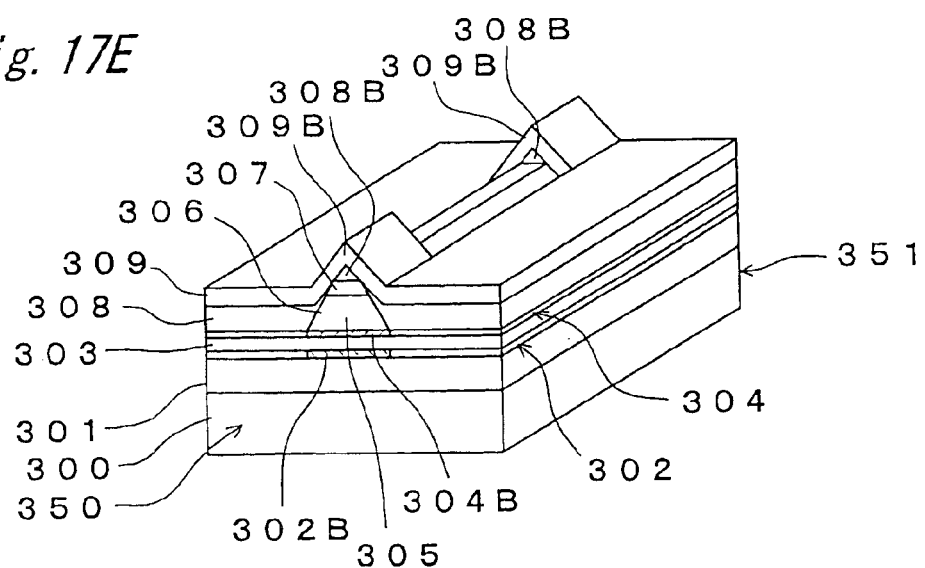
Figure 18A:
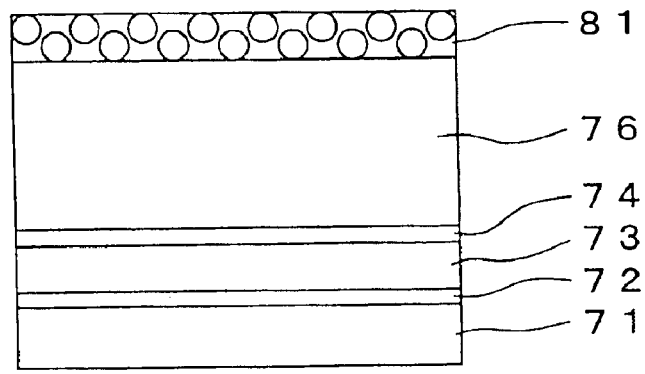
FIGS. 18A, 18B and 18C are views schematically showing how the impurity diffuses when the semiconductor laser fabricating method of the present invention is used.
Figure 18B:
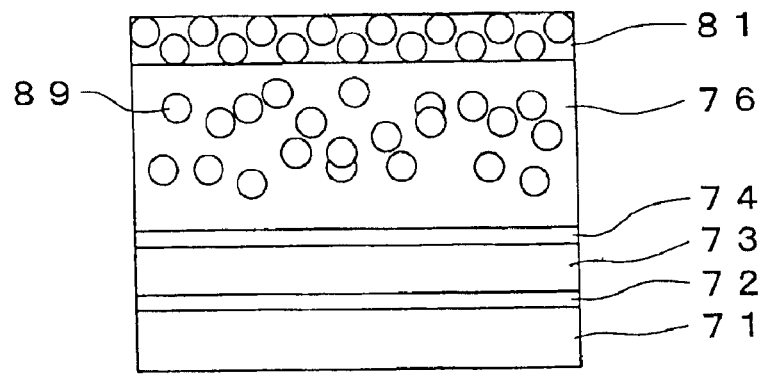
Figure 18C:
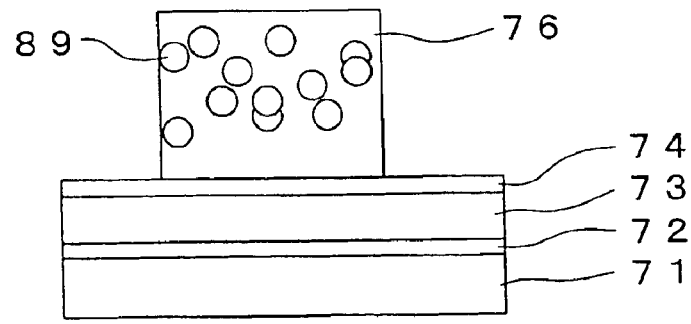
Figure 19A:
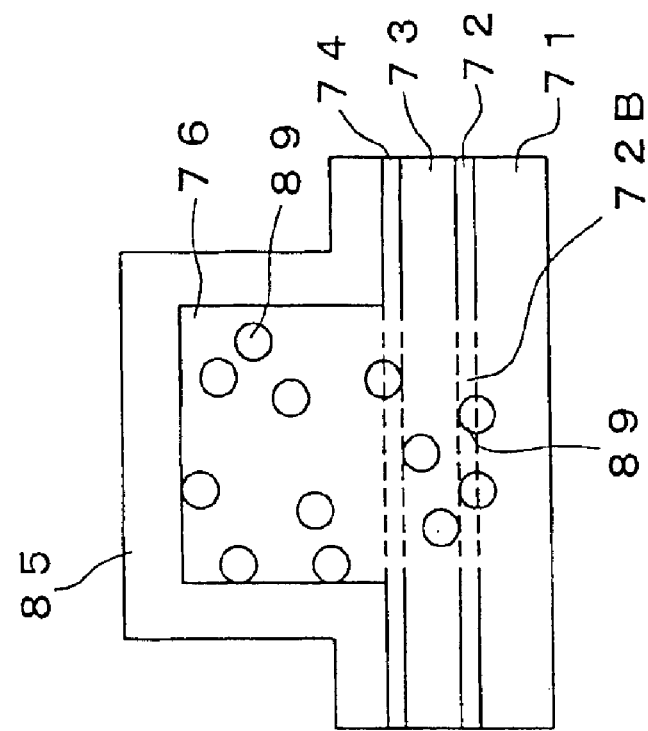
FIGS. 19A and 19B are views schematically showing how the impurity diffuses when the semiconductor laser fabricating method of the present invention is used.
Figure 19B:
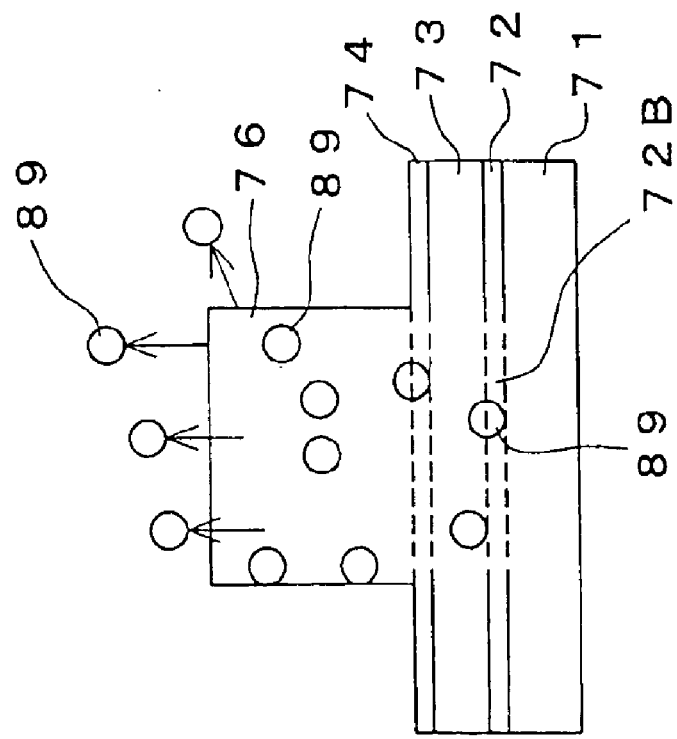
Figure 20:
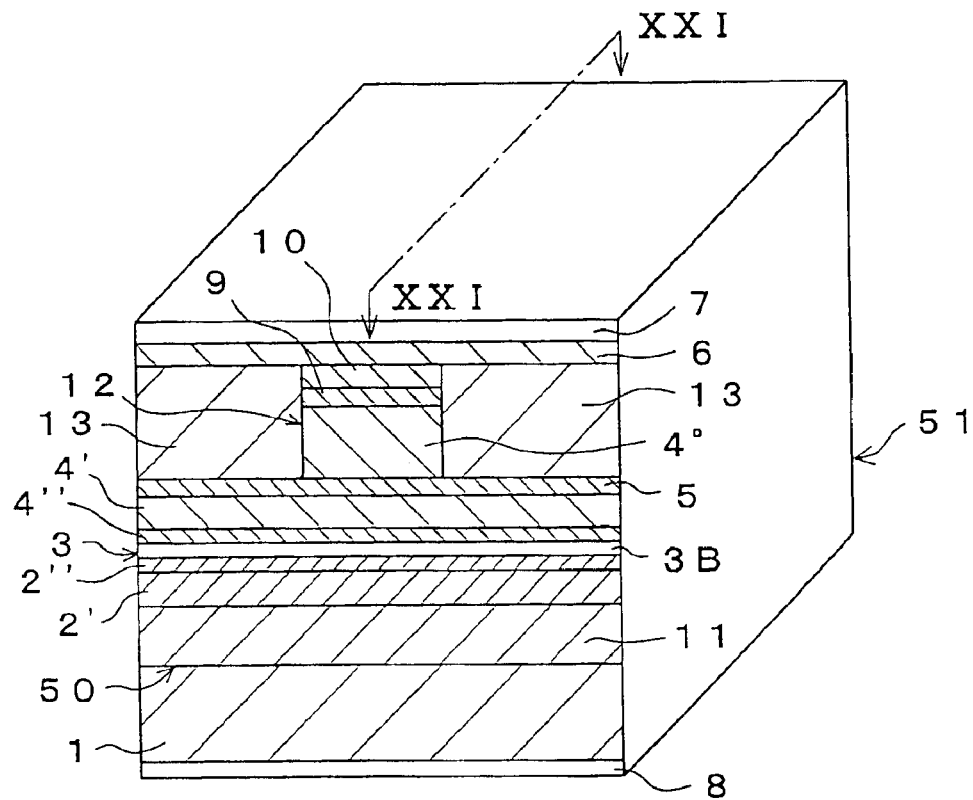
FIG. 20 is a perspective view of a prior art semiconductor laser.
Figure 21:
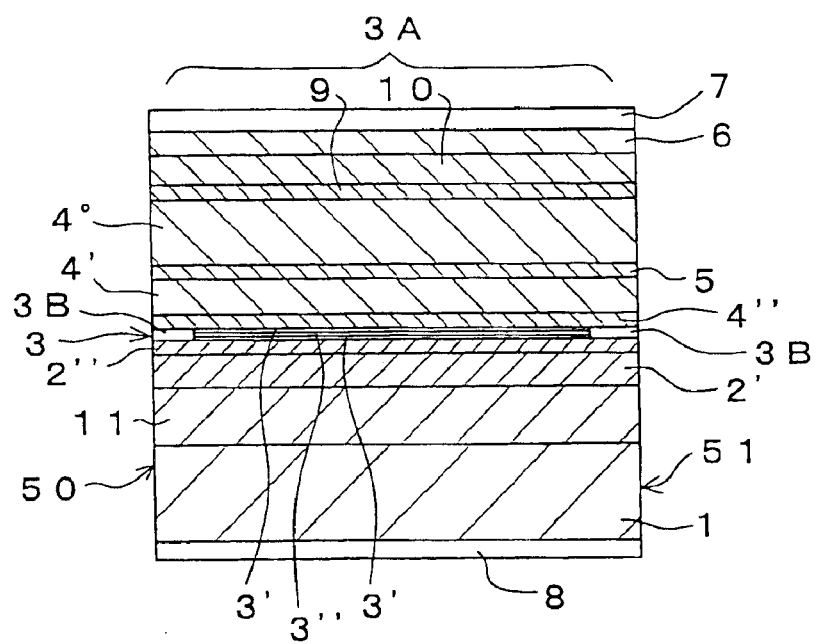
FIG. 21 is a sectional view taken along line XXI—XXI of FIG. 23.
Figure 22:
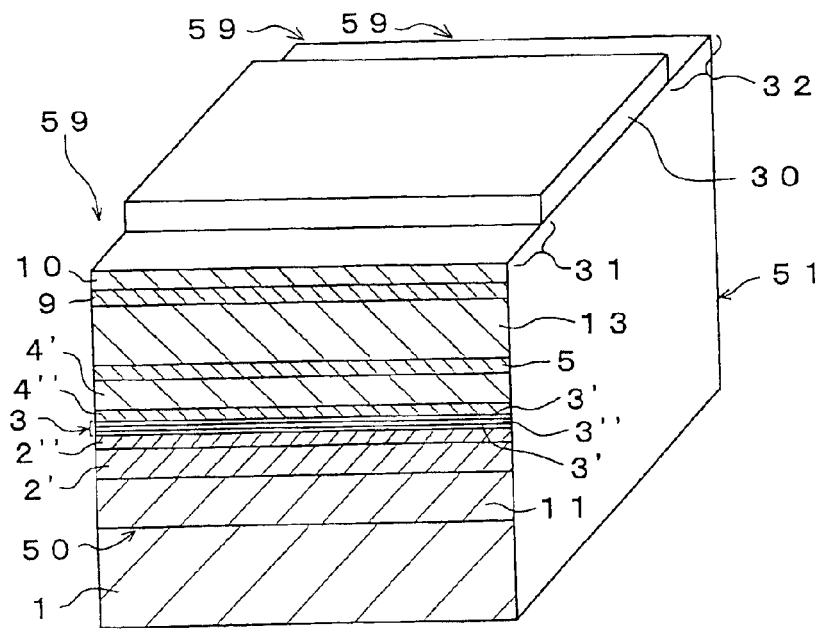
FIG. 22 is a view for explaining the fabricating process of the prior art semiconductor laser.
Figure 23:
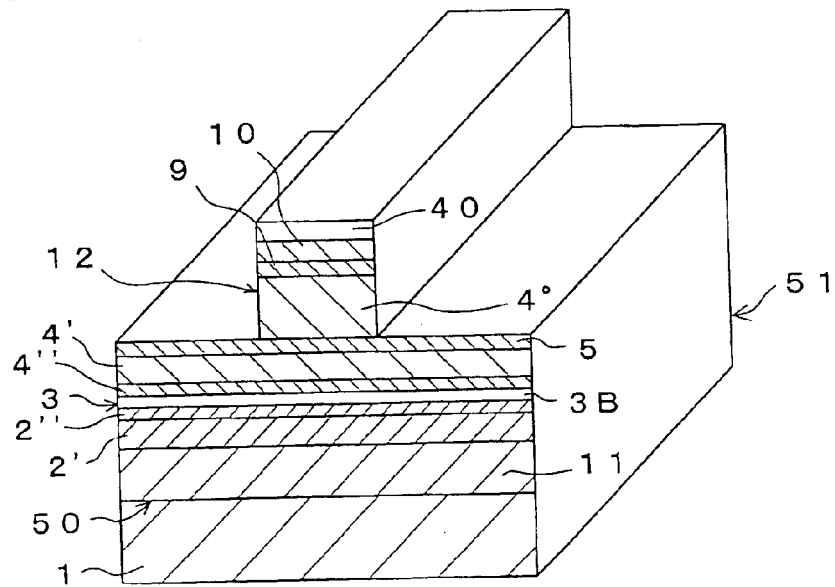
FIG. 23 is a view for explaining the fabricating process of the prior art semiconductor laser.

As shown in FIG. 17E, the $SiO_2$ layer 330 is removed by buffered hydrofluoric acid. Then, portions existing on the ridge 305 and in regions other than the regions located near the light-emitting end surfaces 350 and 351 are removed from the n-type $Al_{0.7}Ga_{0.3}As$ current blocking layer 308 and the p-type GaAs layer 309. That is, of all potions of the n-type $Al_{0.7}Ga_{0.3}As$ current blocking layer 308 and the p-type GaAs layer 309, the portions 309B and 308B that exist in the regions located near the light-emitting end surfaces 350 and 351 as well as the portions (indicated by 309 and 308) that exist on both sides of the ridge 305 are left intact.

Subsequently, as shown in FIG. 14, a p-type GaAs contact layer 310 (having a thickness of 4 $\mu$m) is formed over the substrate 300, i.e., the wafer, and electrodes 315 and 316 are further formed on the lower and upper surfaces, respectively, of the wafer (completion of the wafer fabrication). Subsequently, the wafer is cleaved along the regions where the light-emitting end surfaces 350 and 351 are to be formed, i.e., in a manner that the portions 302B of the active layer 302, where the intermixing took place, become resonator end surfaces. Then, coating is performed so that the one end surface 350 comes to have a reflectance of 12% and the end surface 351 located on the opposite side comes to have a reflectance of 95%, as light-emitting end surfaces (completion of the laser chip fabrication). The resonator length was set to 800 $\mu$m, and the length of the intermixed portions 302B of the active layer 302 was set to 25 $\mu$m at both of the light-emitting end surface 350 and the end surface 351 located on the opposite side.

Each laser chip was mounted on a stem, and the characteristics were examined with a current applied. A maximum optical output of 325 mW was obtained at a wavelength of 786 nm and it was confirmed that COD was not generated. Moreover, a leak current, which might be generated when the etching stopper layer was destroyed in the etching stage, was not observed.

The p-type dopant was Be in the present embodiment. However, even by employing another dopant of a small diffusion coefficient, in particular, C, satisfactory device characteristics (laser oscillation threshold value, etc.) can be obtained with the diffusion of the p-type dopant into the active layer restrained.

Moreover, the p-type etching stopper layer 304 was made of GaAs in the present embodiment. However, when hydrofluoric acid or buffered hydrofluoric acid is used as an etchant, no erosion will occur even with $Al_xGa_{1-x}As$ of a crystal mixture ratio x of not higher than 0.3. When $Al_xGa_{1-x}As$ ($x \leq 0.3$) is adopted as a material for the etching stopper layer, the bandgap of the etching stopper layer increases as the value of x increases, so that the rate of reabsorbing light, generated in the active layer, is reduced.

Moreover, an ordinary annealing furnace was used for the first annealing and RTA was used for the second annealing in the present embodiment. However, this combination is arbitrary or optional.

Moreover, although the active layer 302 was of AlGaAs in the present embodiment, the present invention is not limited to this. By sandwiching an InGaAs quantum well layer by barrier layers of GaAs or AlGaAs, the oscillation wavelength may be set at, for example, 980 nm.

Even when materials other than the materials described in connection with each of the aforementioned embodiments, the present invention can generally be applied to the window type semiconductor lasers that have an etching stopper layer. It is also possible to combine compositions that do not contain Al, which are considered to hardly cause COD, such as a combination of GaInAsP cladding layers with an InGaAs active layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser, which emits laser light through a light-emitting end surface, comprising:

a lower cladding layer, an active layer for generating laser light, a first upper cladding layer and an etching stopper layer stacked in this order on a substrate;

a second upper cladding layer formed in a shape of a ridge on the etching stopper layer, the ridge extending perpendicularly to the light-emitting end surface;

a current blocking layer disposed in regions on both sides of the second upper cladding layer; and an impurity diffused in a portion extending along the light-emitting end surface from the etching stopper layer to the active layer and located at least under the ridge for local intermixing in this portion to restrain laser light absorption, wherein in a region along the light-emitting end surface, the etching stopper layer has a bandgap smaller in portions thereof disposed in positions corresponding to both sides of the ridge than in a portion thereof located just under the ridge.

2. The semiconductor laser as claimed in claim 1, wherein in the region along the light-emitting end surface, the active layer has a bandgap larger in a portion thereof located just under the ridge than in portions thereof disposed in positions corresponding to both sides of the ridge.

3. The semiconductor laser as claimed in claim 2, wherein in the region along the light-emitting end surface, a photoluminescence wavelength shift to a shorter wavelength side due to the local intermixing of the active layer in the portion located just under the ridge is 18 nm or more, and a photoluminescence wavelength shift to the shorter wavelength side due to the local intermixing of the active layer in the portions corresponding to both sides of the ridge is not larger than 15 nm.

4. The semiconductor laser as claimed in claim 1, wherein the first upper cladding layer contains a diffused impurity of Be or C, and the impurity diffused in said portion extending along the light-emitting end surface from the etching stopper layer to the active layer is Zn.

5. The semiconductor laser as claimed in claim 4, wherein the second upper cladding layer contains a diffused impurity of Be or C.

6. The semiconductor laser as claimed in claim 1, wherein the active layer comprises at least one quantum well layer and barrier layers alternating with the quantum well layer;

the at least one quantum well layer is constructed of $(Al_xGa_{1-x})_yIn_{1-y}P$ ($0 \leq x \leq 1$ and $0 \leq y \leq 1$); and the barrier layers are constructed of $(Al_xGa_{1-x})_yIn_{1-y}P$ ($0 \leq x \leq 1$ and $0 \leq y \leq 1$) whose Al content (x) is greater than that of the quantum well layer.

7. The semiconductor laser as claimed in claim 6, wherein the etching stopper layer is constructed of $Ga_yIn_{1-y}P$ ($0 \leq y \leq 1$); and the first and second upper cladding layers are each constructed of $(Al_xGa_{1-x})_yIn_{1-y}P$ ($0 \leq x \leq 1$ and $0 \leq y \leq 1$).

8. The semiconductor laser as claimed in claim 1, wherein the active layer comprises at least one quantum well layer and barrier layers alternating with the quantum well layer;

the at least one quantum well layer is constructed of $In_zGa_{1-z}As$ ($0 \leq z \leq 1$) or $Al_xGa_{1-x}As$ ($0 \leq x \leq 1$); and the barrier layers are constructed of $Al_xGa_{1-x}As$ ($0 \leq x \leq 1$) whose Al content (x) is greater than that of the quantum well layer when the latter is constructed of $Al_xGa_{1-x}As$ ($0 \leq x \leq 1$).

9. The semiconductor laser as claimed in claim 8, wherein the etching stopper layer is constructed of $Al_xGa_{1-x}As$ ($0 \leq x \leq 0.3$), and the first and second upper cladding layers are each constructed of $Al_yGa_{1-y}As$ ($x < y \leq 1$).

* * * * *